(12) United States Patent
Chandra et al.

(10) Patent No.: US 11,656,264 B2
(45) Date of Patent: May 23, 2023

(54) HIGH-SPEED SIGNAL SUBSYSTEM TESTING SYSTEM

(71) Applicant: Dell Products L.P., Round Rock, TX (US)

(72) Inventors: Umesh Chandra, Santa Cruz, CA (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/374,119

(22) Filed: Jul. 13, 2021

(65) Prior Publication Data

US 2023/0018015 A1    Jan. 19, 2023

(51) Int. Cl.
| | |
|---|---|
| G01R 31/11 | (2006.01) |
| G01R 31/08 | (2020.01) |
| G06F 17/14 | (2006.01) |
| G01M 11/00 | (2006.01) |
| G01R 31/68 | (2020.01) |

(52) U.S. Cl.
CPC ......... *G01R 31/11* (2013.01); *G01M 11/3109* (2013.01); *G01R 31/083* (2013.01); *G01R 31/68* (2020.01); *G06F 17/142* (2013.01)

(58) Field of Classification Search
CPC . G01R 31/08–086; G01R 31/11; G01R 31/68
See application file for complete search history.

(56) References Cited

U.S. PATENT DOCUMENTS

| | | | | | |
|---|---|---|---|---|---|
| 3,434,049 | A | * | 3/1969 | Frye ................... | G01R 31/11 324/533 |
| 4,970,466 | A | * | 11/1990 | Bolles ................. | G01R 31/11 379/22.03 |
| 6,992,491 | B1 | * | 1/2006 | Lo ....................... | G01R 31/58 324/543 |
| 7,075,283 | B1 | * | 7/2006 | Lo ....................... | G01R 31/11 324/543 |

(Continued)

FOREIGN PATENT DOCUMENTS

| | | | | | |
|---|---|---|---|---|---|
| CN | 110687396 | A | * | 1/2020 | .......... G01R 31/083 |
| EP | 1623239 | B1 | * | 11/2013 | ............. G01R 31/11 |

*Primary Examiner* — Patrick Assouad
*Assistant Examiner* — Demetrius R Pretlow
(74) *Attorney, Agent, or Firm* — Joseph Mencher

(57) ABSTRACT

A high-speed signal subsystem testing system includes a processing system having a transmitter and a receiver, a loop back subsystem coupled to the transmitter and receiver to provide a testing communication path between the transmitter and the receiver, and a communication path testing engine coupled to the transmitter and the receiver. The communication path testing engine generates test signal(s) and transmits the test signal(s) via the transmitter and through the testing communication path provided by the loop back subsystem and, in response, receives test signal result(s) via the receiver and through the testing communication path provided by the loop back subsystem, The communication path testing engine processes the test signal result(s) to generate a testing impedance profile for the testing communication path, and compares the testing (Continued)

impedance profile to an expected impedance profile to determine whether a testing communication path issue exists in the testing communication path.

20 Claims, 16 Drawing Sheets

(56) References Cited

U.S. PATENT DOCUMENTS

| | | | |
|---|---|---|---|
| 9,696,361 B1* | 7/2017 | Sun | G01R 27/28 |
| 2005/0264297 A1* | 12/2005 | Gorka | G01R 27/04 |
| | | | 324/525 |
| 2009/0228222 A1* | 9/2009 | Fantoni | G01R 27/04 |
| | | | 702/59 |
| 2010/0188095 A1* | 7/2010 | Maslen | G01R 31/11 |
| | | | 324/533 |
| 2010/0211348 A1* | 8/2010 | Gray | G01R 31/11 |
| | | | 702/124 |
| 2013/0221974 A1* | 8/2013 | Julson | G01R 31/11 |
| | | | 324/537 |
| 2015/0253370 A1* | 9/2015 | Fantoni | G01R 31/11 |
| | | | 702/58 |
| 2016/0266204 A1* | 9/2016 | Chandra | G06F 11/00 |
| 2016/0276820 A1* | 9/2016 | Olivas | H02H 1/0061 |
| 2018/0198888 A1* | 7/2018 | King | H04L 41/0806 |
| 2019/0391191 A1* | 12/2019 | Obbalareddi Demudu | |
| | | | G01R 27/16 |
| 2020/0110002 A1* | 4/2020 | Hyre | G01M 5/0008 |

* cited by examiner

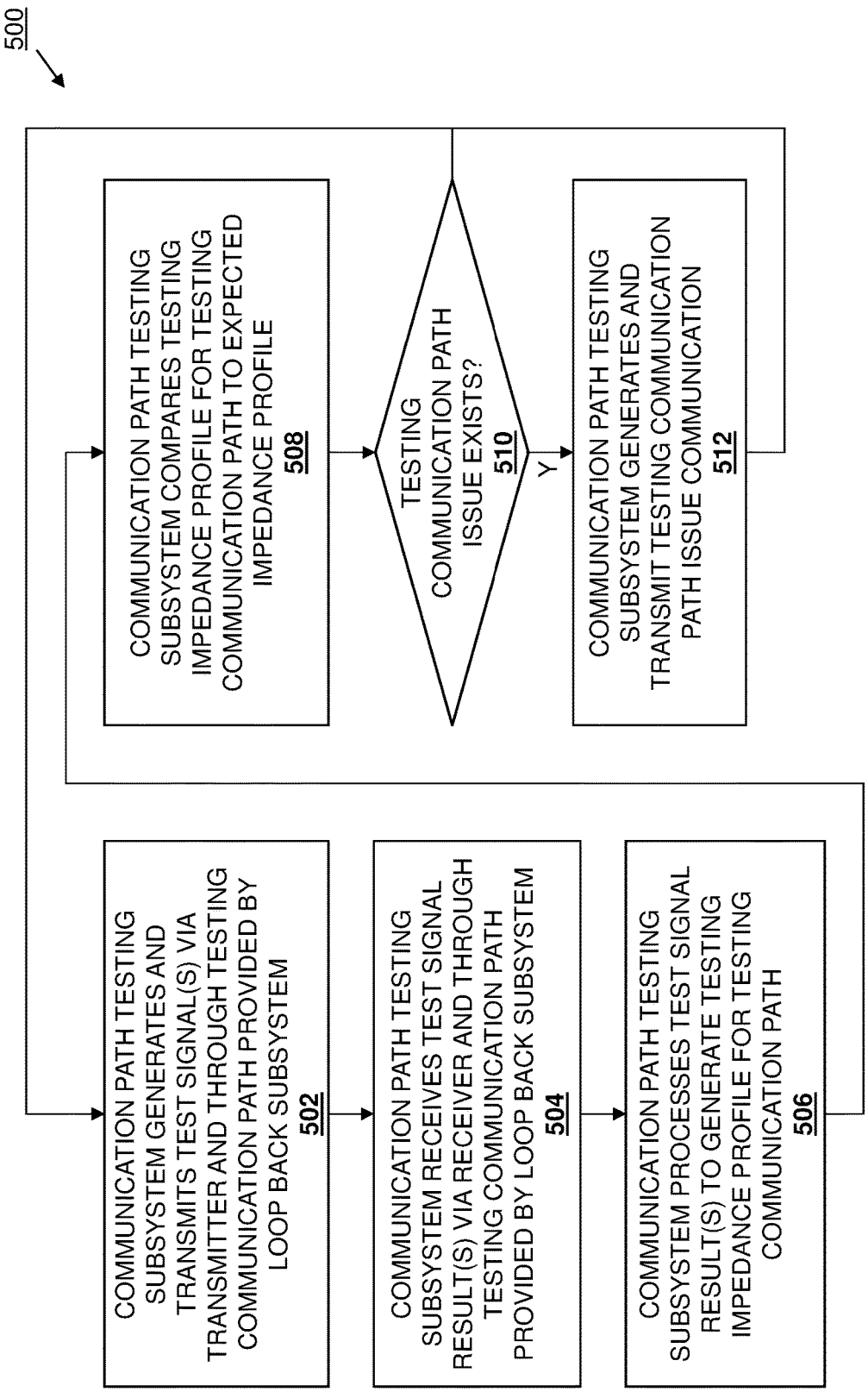

HIGH-SPEED SIGNAL SUBSYSTEM TESTING SYSTEM

BACKGROUND

The present disclosure relates generally to information handling systems, and more particularly to testing high-speed signal subsystems in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switch devices and/or other networking devices known in the art, are utilized to transmit signals, and it is desirable to test the signaling subsystems in the switch device to ensure they will operate to properly transmit signals during operation. For example, conventional In-Circuit Test (ICT) systems may be utilized to test signaling subsystems in switch devices that provide the connections between a Network Processing Unit (NPU) and switch ports (e.g., provided by Quad Small Form-factor Pluggable (QSFP) transmitter device connectors) in the switch device, but suffer from several issues. For example, in order to allow a conventional ICT with the power turned on or off to the switch device, Surface Mount Technology (SMT) test point pads are often provided on the circuit board in the switch device on either end of a trace that is to-be tested on the circuit board, or on either end of a component (e.g., a resistor) that is to-be tested, in order to allow ICT probes to engage those SMT test point pads and perform the test.

However, traces may be provided as buried stripline traces that extend between a SMT connector for a switch port on the circuit board and an NPU Ball Grid Array (BGA) pad on the circuit board, and that stripline trace may be run with either a blind via or a backdrilled via. As will be appreciated by one of skill in the art, such signaling subsystem configurations prevents access by the ICT probes to the stripline trace (e.g., due to the backdrilled via) or the SMT connector (e.g., due to a "belly-to-belly" cage on the SMT connector), while the NPU will block access to the NPU BGA pad and breakout vias when that NPU is mounted to the circuit board. As such, SMT test point pads may only be provided for the accessible portions of the stripline trace connection and outside the NPU footprint and switch port footprint, and are limited to providing testing that does not determine the integrity of the soldered NPU BGA pad connection or the soldered switch port connection. Furthermore, the placement of such SMT test point pads on the circuit board can result in reflections, insertion losses, and return losses when the circuit board and its traces are used to transmit high-speed signals (e.g., via differential trace pairs), and thus such SMT test pad techniques are not utilized with high-speed differential traces on circuit boards that are utilized to transmit high-speed signals (e.g., 3 GB/s to 28 GB/s Non-Return to Zero signals, 56 GB/s to 112 GB/s Pulse Amplitude Modulation 4 (PAM4) signals, and/or other high-speed signals known in the art). As such, conventional ICTs are limited to relatively lower speed differential traces and single ended signals, and Joint Test Action Group (JTAG) testing techniques suffer from similar limitations.

Conventional solutions to such issues provide for signal testing of the final, fully assembled switch device by configuring a testing system with loopback modules connected to each of the connections (e.g., QSFP DD ports) that are coupled to the transmitters and receivers in the switch device, and then running a system test (e.g., a Pseudo Random Binary Sequence (PRBS) traffic test) and identifying packet drops to detect when a particular switch connection (e.g., QSFP DD port) is experiencing issues transmitting or receiving signals (e.g., via the generation of eye diagrams based on full-speed data transmissions). In the event an issue is identified with a particular switch connection (e.g., QSFP DD port) during testing, that issue may be assumed to be associated with the NPU transmitter, the NPU receiver, the connection of the NPU to the BGA pad, the transmitter differential trace pair to the QSFP DD connector, the receiver differential trace pair to the QSFP DD connector, the connection of the QSFP DD connector to the circuit board, a bent pin on the QSFP DD connector, or a cable connected to the QSFP DD connector. Furthermore, while a particular differential trace pair may be identified as having an issue, such conventional solutions do not allow for a determination of whether the issue is associated with the positive or negative trace in that differential trace pair. The switch device must then be disassembled, the circuit board replaced, and the software reinstalled so that the testing may be performed again. As will be appreciated by one of skill in the art, such solutions do not test high-speed connectivity, are time consuming and costly, are often not worthwhile to perform, and can result in the provisioning of switch devices with signaling issues to a customer.

Accordingly, it would be desirable to provide a high-speed signal subsystem testing system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a communication path testing engine that is configured to: generate at least one test signal and transmit the at least one test signal via a transmitter and through a testing communication path provided by a loop back subsystem; receive, in response to transmitting the at least one test signal, at least one test signal result via a receiver and through the testing communication path provided by the loop back subsystem; process the at least one test signal result to generate a testing impedance profile for the testing communication path; and compare the testing impedance profile for the testing communication path to an expected impedance profile to determine whether a testing communication path issue exists in the testing communication path.

BRIEF DESCRIPTION OF THE DRAWINGS

FIG. 5 is a flow chart illustrating an embodiment of a method for testing high-speed signaling subsystems.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
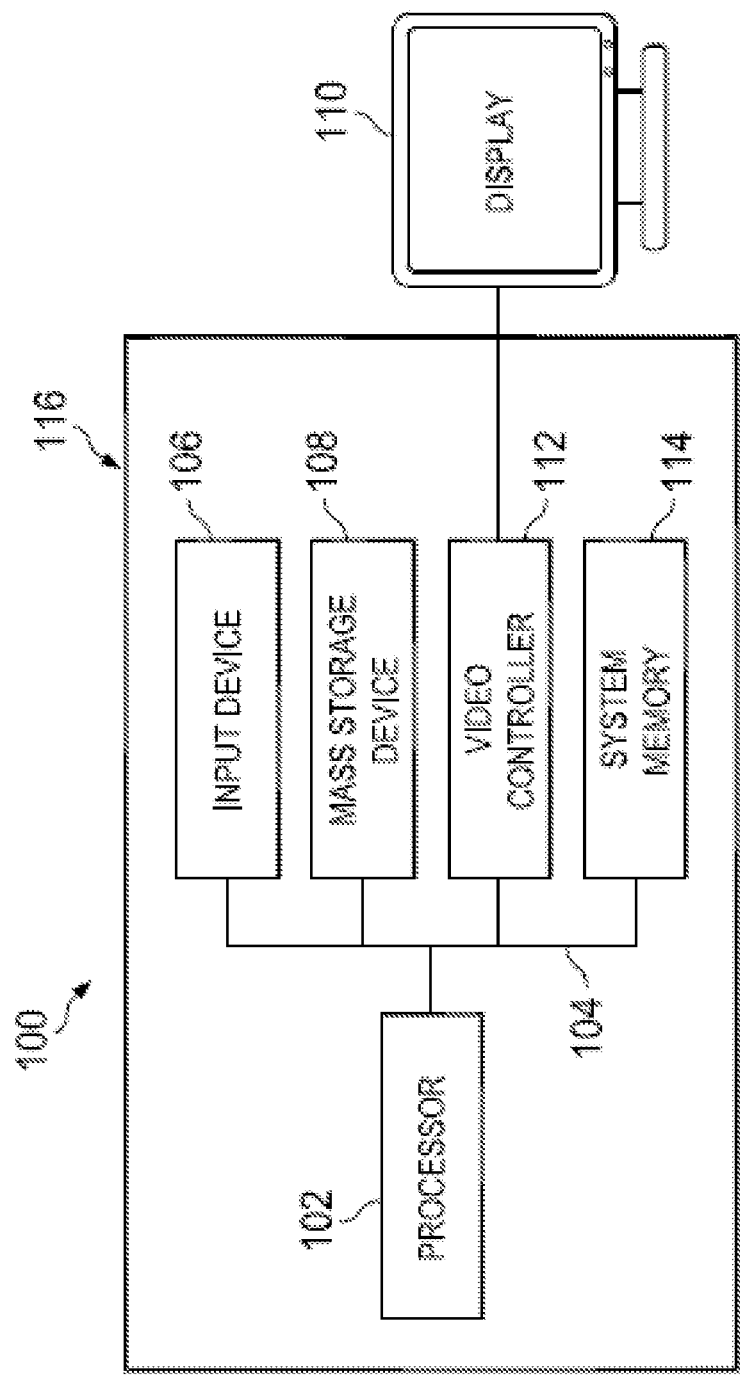
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
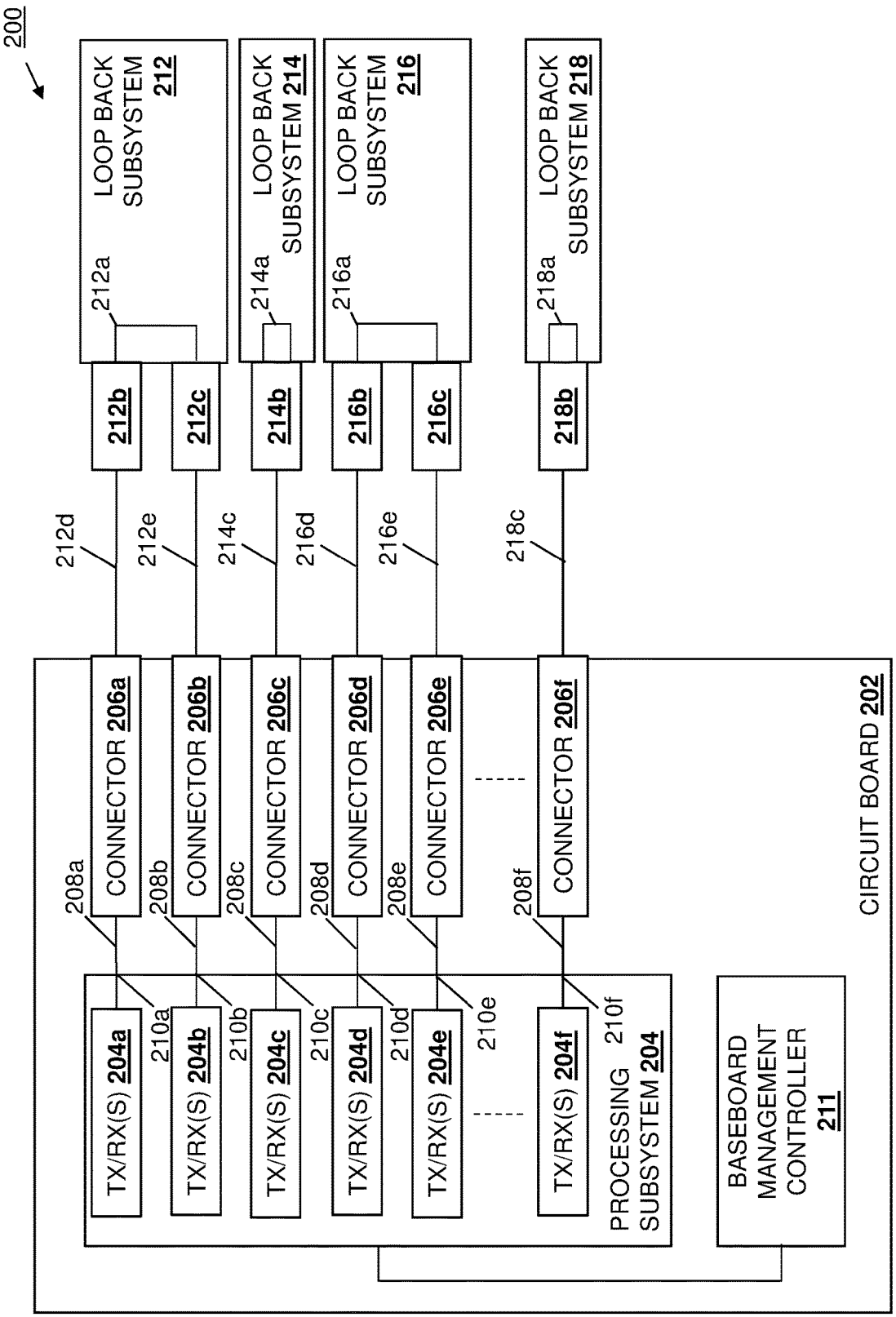
FIG. 2 is a schematic view illustrating an embodiment of a high-speed signal subsystem testing system.

Referring now to FIG. 2, an embodiment of a high-speed signal subsystem testing system 200 is illustrated. In the illustrated embodiment, the high-speed signal subsystem testing system 200 includes a circuit board 202. In an embodiment, the circuit board 202 may be provided (or configured to be provided) in the IHS 100 discussed above with reference to FIG. 1, may include some or all of the components of the IHS 100, and in the specific examples below is described as being provided (or configured to be provided) in a switch device or other networking device known in the art. However, while illustrated and discussed as being configured to be provided in a switch device, one of skill in the art in possession of the present disclosure will recognize that circuit boards tests using the high-speed signal subsystem testing system 200 of the present disclosure may include any of a variety of circuit boards configured for provisioning in any of a variety of devices while remaining within the scope of the present disclosure as well. In the illustrated embodiment, the circuit board includes a processing subsystem 204 that, in the examples described below, is provided by a Network Processing Unit (NPU), but that one of skill in the art in possession of the present disclosure will recognize may be provided by other processing systems while remaining within the scope of the present disclosure as well. As discussed below, the processing subsystem 204 may be mounted (e.g., soldered) to the circuit board via BGA pads (e.g., the NPU BGA pads in the example below).

In the illustrated embodiment, the processing subsystem 204 includes a plurality of transmitter/receivers (TX/RX(S)) 204a, 204b, 204c, 204d, 204e, and up to 204f. Furthermore, the circuit board 202 also includes a plurality of connectors 206a, 206b, 206c, 206d, 206e, and up to 206f, each of which may be mounted (e.g., soldered) to the circuit board 202 (e.g., via the SMT connectors discussed above). As illustrated, each of the connectors 206a-206f may be coupled to respective transmitter/receiver(s) 208a-208f by respective traces (e.g., differential trace pairs) that extend through the circuit board 202 between that connector and a BGA pad to which the processing subsystem 204 is mounted and to which its transmitter/receiver(s) are coupled. As such, the connector 206a is coupled to the transmitter/receiver(s) 204a by traces 208a (e.g., differential trace pairs) extending between the connector 206a and the BGA pad 210a that is coupled to the transmitter/receiver(s) 204a in the processing subsystem 204, the connector 206b is coupled to the transmitter/receiver(s) 204b by traces 208b (e.g., differential trace pairs) extending between the connector 206b and the BGA pad 210b that is coupled to the transmitter/receiver(s) 204b in the processing subsystem 204, the connector 206c is coupled to the transmitter/receiver(s) 204c by traces 208c (e.g., differential trace pairs) extending between the connector 206c and the BGA pad 210c that is coupled to the transmitter/receiver(s) 204c in the processing subsystem 204, the connector 206d is coupled to the transmitter/receiver(s) 204d by traces 208d (e.g., differential trace pairs) extending between the connector 206d and the BGA pad 210d that is coupled to the transmitter/receiver(s) 204d in the processing subsystem 204, the connector 206e is coupled to the transmitter/receiver(s) 204e by traces 208e (e.g., differential trace pairs) extending between the connector 206e and the BGA pad 210e that is coupled to the transmitter/receiver(s) 204e in the processing subsystem 204, and the connector 206f is coupled to the transmitter/receiver(s) 204f by traces 208f (e.g., differential trace pairs) extending between the connector 206f and the BGA pad 210f that is coupled to the transmitter/receiver(s) 204f in the processing subsystem 204.

In a specific example, the circuit board 202 may include 32 Quad Small Form-factor Pluggable (QSFP) Double Density (DD) ports that provide the connectors 206a-206f, with each QSFP DD port connected via 8 transmitter differential trace pairs (e.g., 8 sets of positive/negative transmitter traces) to the NPU, and via 8 receiver differential trace pairs (e.g., 8 sets of positive/negative receiver traces) to the NPU, thus providing (8*2*32=) 512 transmitter traces and (8*2*32=) 512 receiver traces on the circuit board 202 (e.g., the trace(s) 208a-208f). Furthermore, the circuit board 202 may be configured to transmit signals at speeds of greater than 16 Gb/s using a Non-Return to Zero (NRZ) format, and up to 112-224 Gb/s using a PAM4 format which, as discussed above, prevents testing of high-speed connectivity of the differential trace pairs on the circuit board 202 during a powered-on portion of an ICT or JTAG test. However, while a particular circuit board 202 with 32 connectors and 1024 traces is discussed in the examples below, one of skill in the art in possession of the present disclosure will appreciate how circuit boards may utilize more connectors (e.g., 64 connectors) and more traces (e.g., 2048 traces), or fewer connectors (e.g., 16 connectors) and fewer traces (e.g., 512 traces) while remaining within the scope of the present disclosure as well.

In the illustrated embodiment, the circuit board 202 also includes a Baseboard Management Controller (BMC) that is coupled to the processing system 204 and that may be provided by, for example, an integrated DELL® Remote Access Controller (iDRAC) device provided in computing devices available from the DELL® Inc. of Round Rock, Tex. United States. However, while a particular BMC that is integrated in the circuit board 202 is illustrated and described, one of skill in the art in possession of the present disclosure will appreciate that other remote access controller devices/BMCs in other configurations (e.g., separate from the circuit board) will fall within the scope of the present disclosure as well. As will be appreciated by one of skill in the art in possession of the present disclosure, the baseboard management controller 211 may include at least one BMC processing device (not illustrated, but which may include the processor 102 discussed above with reference to FIG. 1) and at least one BMC memory device that includes instructions that, when executed by the at least one BMC processing device, cause the at least one BMC processing device to perform the functionality of the baseboard management controller 211 discussed below.

Furthermore, one of skill in the art in possession of the present disclosure will appreciate that the processing subsystem 204 and the at least one BMC processing device may provide a communication path testing processing system, the at least one BMC memory device and a memory subsystem utilized by the processing subsystem 204 may provide a communication path testing memory system, and that communication path testing memory system may include instructions that, when executed by the communication path testing processing system, cause the communication path testing processing system to perform the functionality of the communication path testing engines and/or communication path testing subsystems discussed below. However, while a specific communication path testing processing system provided by an NPU and baseboard management controller is described herein, one of skill in the art in possession of the present disclosure will recognize that the functionality of the communication path testing engines and/or communication path testing subsystems described herein may be provided in a variety of manners that will fall within the scope of the present disclosure as well.

In the illustrated embodiment, the high-speed signal subsystem testing system 200 also includes plurality of loop back subsystems 212, 214, 216, and up to 218. In the embodiments illustrated and described below, the loop back subsystems 212 and 216 are multi-connector loop back subsystems that are cabled to multiple connectors on the circuit board 202, while the loop back subsystems 214 and 218 are single-connector loop back subsystems that are cabled to respective single connectors on the circuit board 202. For example, the loop back subsystem 212 includes a loop back circuit 212a connected to loop back connectors 212b and 212c that are coupled via respective cables 212d and 212e to the connectors 206a and 206b, respectively, on the circuit board 202, and as discussed in the specific examples below is configured to provide a communication path between a transmitter in the transmitter/receivers 204a and a receiver in the transmitter/receivers 204b. Similarly, the loop back subsystem 216 includes a loop back circuit 216a connected to loop back connectors 216b and 216c are coupled via respective cables 216d and 216e to the connectors 206d and 206e, respectively, on the circuit board 202, and as discussed in the specific examples below is configured to provide a communication path between a transmitter in the transmitter/receivers 204d and a receiver in the transmitter/receivers 204e. As will be appreciated by one of skill in the art in possession of the present disclosure, the loop back subsystems 212 and 216 may allow a transmitter in one processing system Input/Output (I/O) to send signals to a receiver in a different processing system I/O.

In another example, the loop back subsystem 214 includes a loop back circuit 214a connected to a loop back connector 214b that is coupled to a cable 214c to the connector 206c on the circuit board 202, and as discussed in the specific examples below is configured to provide a communication path between a transmitter in the transmitter/receivers 204c and a receiver in the transmitter/receivers 204c. Similarly, the loop back subsystem 218 includes a loop back circuit 218a connected to a loop back connector 218b that is coupled to a cable 218c to the connector 206f on the circuit board 202, and as discussed in the specific examples below is configured to provide a communication path between a transmitter in the transmitter/receivers 204f and a receiver in the transmitter/receivers 204f. As will be appreciated by one of skill in the art in possession of the present disclosure, the loop back subsystems 214 and 218 may provide a passive channel that loops back a transmitter/receiver pair in a processing system. Furthermore, any of the loop back connectors 212b, 212c, 216b, 216c, 214b, and 218b may be provided by QSFP DD connectors, QSFP28 connectors, SFP DD connectors, SFP+ connectors, and/or other connectors that would be apparent to one of skill in the art in possession of the present disclosure.

However, while two particular types of loop back subsystem are illustrated and described (e.g., single-connector loop back subsystems and a dual-connector loop back subsystems), one of skill in the art in possession of the present disclosure will appreciate how other types of loop back subsystems may be utilized in the high-speed signal subsystem testing system while remaining within the scope of the present disclosure as well. Furthermore, while a specific high-speed signal subsystem testing system 200 has been illustrated and described, one of skill in the art in possession of the present disclosure will recognize that the high-speed signal subsystem testing system of the present disclosure may include a variety of components and component configurations while remaining within the scope of the present disclosure as well.

Figure 3:
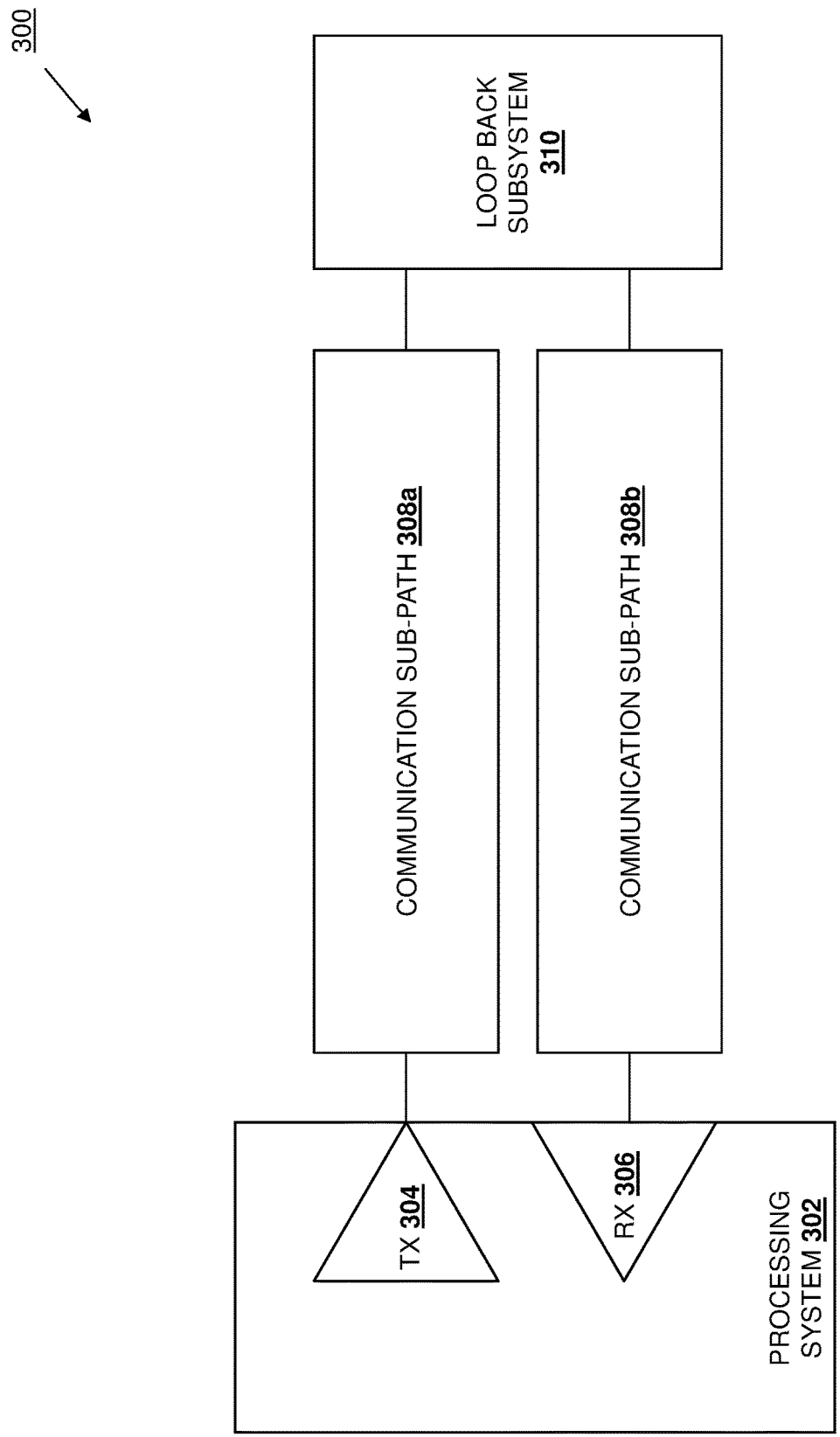
FIG. 3 is a schematic view illustrating an embodiment of a communication path provided between a transmitter and a receiver in the high-speed signal subsystem testing system of FIG. 2.

Referring now to FIG. 3, an embodiment of a communication path 300 provided between a transmitter and a receiver is illustrated for purposes of the discussion below. In the illustrated embodiment, a processing system 302 (which may be the processing system 204 discussed above with reference to FIG. 2) includes a transmitter 304 and the receiver 306 (either of which may be provided in any of the transmitter/receivers 204a-204f discussed above with reference to FIG. 2), and the communication path 300 is provided by a communication sub-path 308a that is connected to the transmitter 304, a communication sub-path 308b that is connected to the receiver 306, and a loop back subsystem 310 (which may be any of the loop back subsystems 212-218) connected to each of the communication sub-paths 308a and 308b. As such, the communication sub-paths 308a and 308b may include processing system mounting elements (e.g., the BGA pads that mount the processing system 302 to a circuit board), circuit board trace(s), connector(s), cable(s), and/or any other communication path elements that would be apparent to one of skill in the art in possession of the present disclosure. As will be appreciated by one of skill in the art in possession of the present disclosure, the communication path 300 may allow a transmitter in a serializer/deserializer (serdes) to send signals to a receiver in that serdes. However, while specific communication paths and communication path elements are illustrated and described herein, one of skill in the art in possession of the present disclosure will appreciate how a variety of communication paths will benefit from the teachings of the present disclosure and thus will fall within its scope as well.

Figure 4:
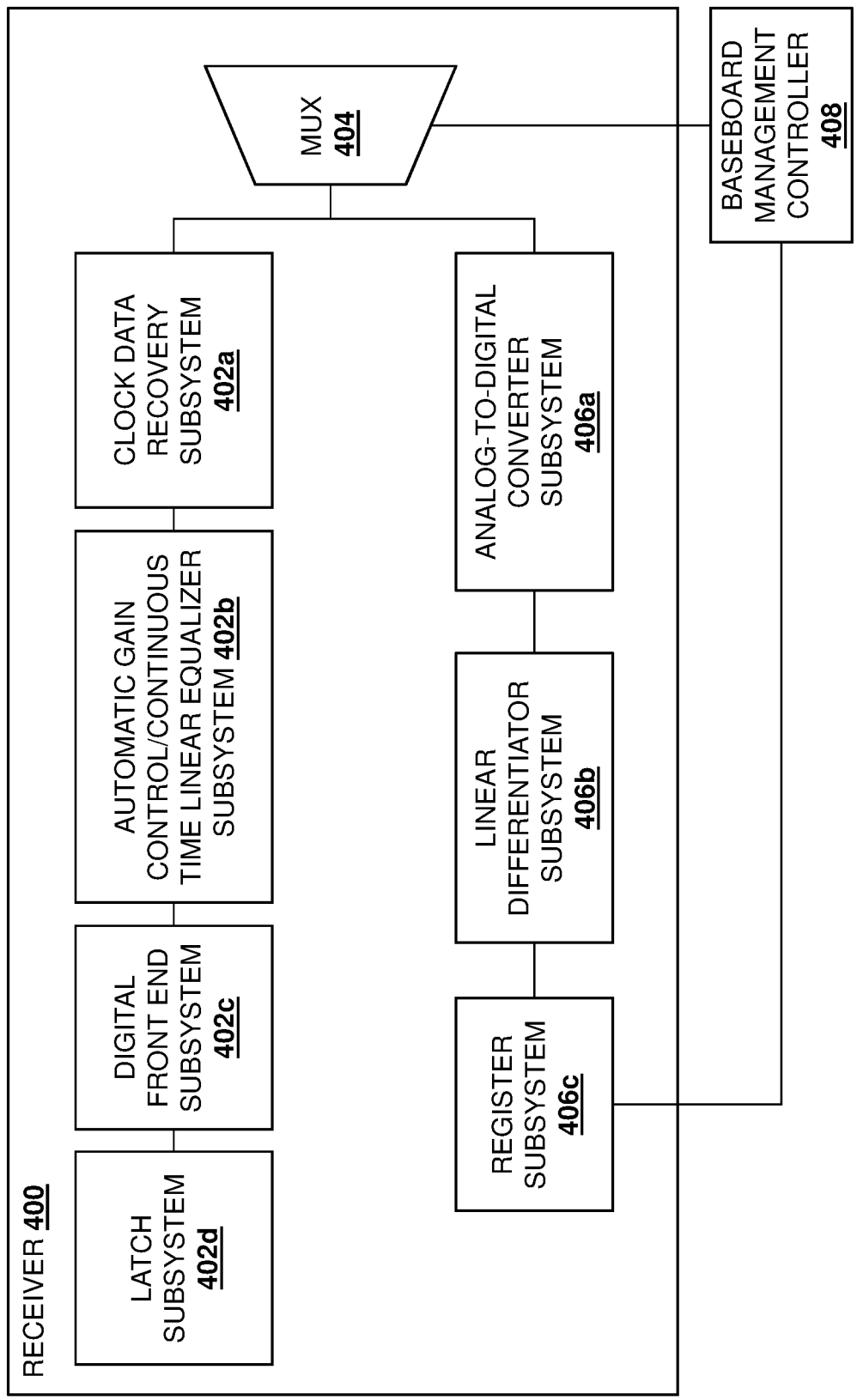
FIG. 4 is a schematic view illustrating an embodiment of a receiver in the high-speed signal subsystem testing system of FIG. 2.

Referring now to FIG. 4, an embodiment of a receiver 400 is illustrated that may provide the receiver 306 discussed above with reference to FIG. 3. In the illustrated embodiment, a first receiver signal path may be provided in the receiver 400 and includes a clock data recovery subsystem 402a, an automatic gain control/continuous time linear equalizer subsystem 402b that is connected to the clock data recovery subsystem 402a, a digital front end subsystem 402c that is connected to the automatic gain control/continuous time linear equalizer subsystem 402b, and a latch subsystem 402d that is connected to the digital front end subsystem 402c. As will be appreciated by one of skill in the art in possession of the present disclosure, the first receiver signal path illustrated in FIG. 4 provides an example of conventional receiver signal paths that are included in conventional receivers and that are configured to receive signals for processing systems such as NPUs.

However, the receiver 400 also includes a multiplexer 404 that is connected to the clock data recovery subsystem 402a in the first receiver signal path, as well as to a second receiver signal path that is provided according to the teachings of the present disclosure to receive the test signal results discussed below. As such, the multiplexer 404 may receive signals and provide them to both the first receiver signal path and the second receiver signal path. In the illustrated embodiment, the second receiver signal path includes an analog-to-digital converter subsystem 406a that is coupled to the multiplexer 404, a linear differentiator subsystem 206b that is coupled to the analog-to-digital converter subsystem 406a, and a register subsystem 406c that is coupled to the linear differentiator subsystem 206b. Finally, a baseboard management controller 408 (which may be the baseboard management controller 211 discussed above with reference to FIG. 2) is coupled to each of the multiplexer 404 and the register subsystem 406c in the second receiver signal path. One of skill in the art in possession of the present disclosure will appreciate how FIG. 4 provides a specific example of a portion of the communication path testing engine discussed above that may be provided by the processing system 204/NPU and the board management controller 211, but as discussed above the communication path testing engine may be provided in a variety of other manners that will fall within the scope of the present disclosure as well.

Referring now to FIG. 5, an embodiment of a method 500 for testing high-speed signaling subsystem is illustrated. As discussed below, embodiments of the systems and methods of the present disclosure provide for the testing of a communication path between transmitter and a receiver that may include trace(s) on a circuit board, connection(s) of the transmitter trace(s) to the transmitter and receiver in a processing system via a pad on the circuit board to which the processing system is mounted, the connection of the transmitter trace(s) to connector(s) on the circuit board, the connector(s), and cabling connected to the connector(s). For example, the high-speed signal subsystem testing system of the present disclosure may include a processing system having a transmitter and a receiver, a loop back subsystem coupled to the transmitter and receiver to provide a testing communication path between the transmitter and the receiver, and a communication path testing engine coupled to the transmitter and the receiver. The communication path testing engine generates test signal(s) and transmits the test signal(s) via the transmitter and through the testing communication path provided by the loop back subsystem and, in response, receives test signal result(s) via the receiver and through the testing communication path provided by the loop back subsystem, The communication path testing engine processes the test signal result(s) to generate a testing impedance profile for the testing communication path, and compares the testing impedance profile to an expected impedance profile to determine whether a testing communication path issue exists in the testing communication path. As such, communication paths between transmitters and receivers on circuit boards may have their high-speed connectivity tested to determine whether any portion of the high-speed signal subsystem associated with that communication path is experiencing issues that would prevent its desired operation.

The method 500 begins at block 502 where a communication path testing subsystem generates and transmits test signal(s) via a transmitter and through a testing communication path provided by a loop back subsystem. With reference to FIG. 2, prior to the method 500, the loop back subsystem 212 may be coupled to the circuit board 202 by connecting the loop back connectors 212b and 212c on the loop back subsystem 212 to the connectors 206a and 206b, respectively, on the circuit board 202 via the cables 212d and 212e, respectively; the loop back subsystem 214 may be coupled to the circuit board 202 by connecting the loop back connector 214b on the loop back subsystem 214 to the connector 206c on the circuit board 202 via the cable 214c; the loop back subsystem 216 may be coupled to the circuit board 202 by connecting the loop back connectors 216b and 216c on the loop back subsystem 216 to the connectors 206d and 206e, respectively, on the circuit board 202 via the cables 216d and 216e, respectively; and the loop back subsystem 218 may be coupled to the circuit board 202 by connecting the loop back connector 218b on the loop back subsystem 218 to the connector 206f on the circuit board 202 via the cable 218c.

Figure 8:
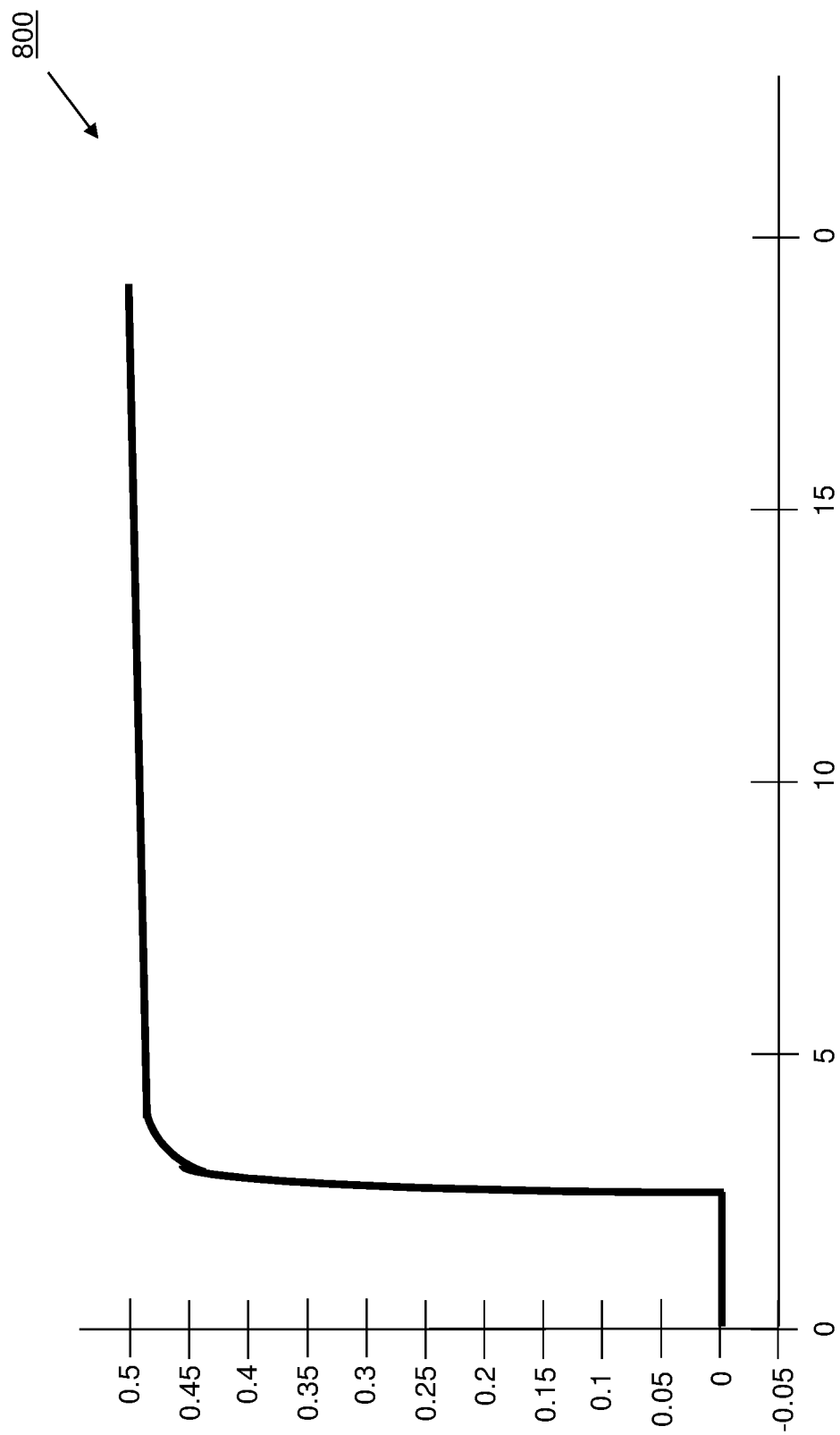
FIG. 8 is an embodiment of a test signal that may be utilized in the high-speed signal subsystem testing system of FIG. 2 during the method of FIG. 5.

In an embodiment, at block 502, the communication path testing engine provided by the baseboard management controller 211 and/or the processing system 204 may generate test signal(s) and cause any of the transmitters in the transmitter receivers 204a-204f to transmit those test signal(s) through a testing communication path to a loop back subsystem. For example, with reference to FIG. 8, an embodiment of a test signal 800 is illustrated. As will be appreciated by one of skill in the art in possession of the present disclosure, the test signal 800 is illustrated as being provided by a step function, and in specific examples may be provided by a Time-Domain Reflectometer (TDR) test signal/step function. In a specific example, the test signal 800 may be generated via a relatively long series of 0's and 1's (e.g., 500 0's followed by 1500 1's) in a manner described by one of the inventors of the present disclosure in U.S. Pat. No. 9,785,607, issued on Oct. 10, 2017, and U.S. Pat. No. 9,634,777, issued on Apr. 25, 2017, which teach techniques for identifying die-die loss transfer functions and die-die impedance transfer functions, and the disclosures of which are incorporated by reference herein in their entirety. As such, the test signal 800 may be provided to any of the transmitters in the transmitter receivers 204a-204f at block 502 for transmission into the communication path 300 connected to that transmitter. However, while a specific test signal has been described, one of skill in the art in possession of the present disclosure will appreciate how other test signals may be utilized while remaining within the scope of the present disclosure as well.

Figure 6A:
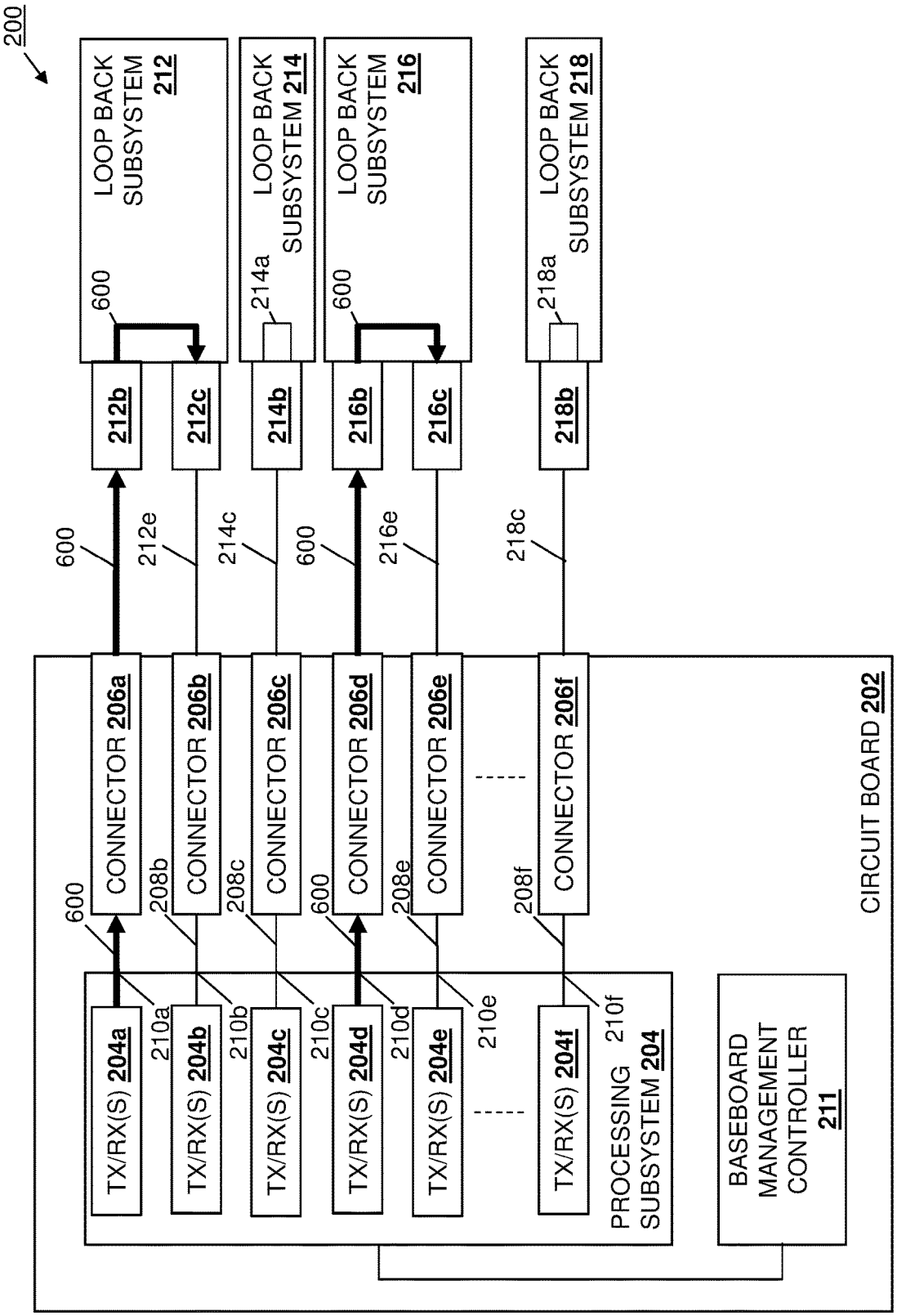
FIG. 6A is a schematic view illustrating an embodiment of the high-speed signal subsystem testing system of FIG. 2 operating during the method of FIG. 5.

With reference to FIGS. 2 and 6A and in an embodiment of block 502 that illustrates the use of multi-connector loop back subsystems, a transmitter in the transmitter/receiver(s) 204a may perform test signal transmission operations 600 that include transmitting test signal(s) via the BGA pad 210a, the trace 208a, the connector 206a, and the cable 212a, such that the test signal(s) are received by the loop back subsystem 212 via its loop back connector 212a and provided to the loop back connector 212c. Similarly, with reference to FIGS. 2 and 6A, a transmitter in the transmitter/receiver(s) 204d may perform the test signal transmission operations 600 that include transmitting test signal(s) via the BGA pad 210d, the trace 208d, the connector 206d, and the cable 216c, such that the test signal(s) are received by the loop back subsystem 216 via its loop back connector 216a and provided to the loop back connector 216c.

Figure 7A:
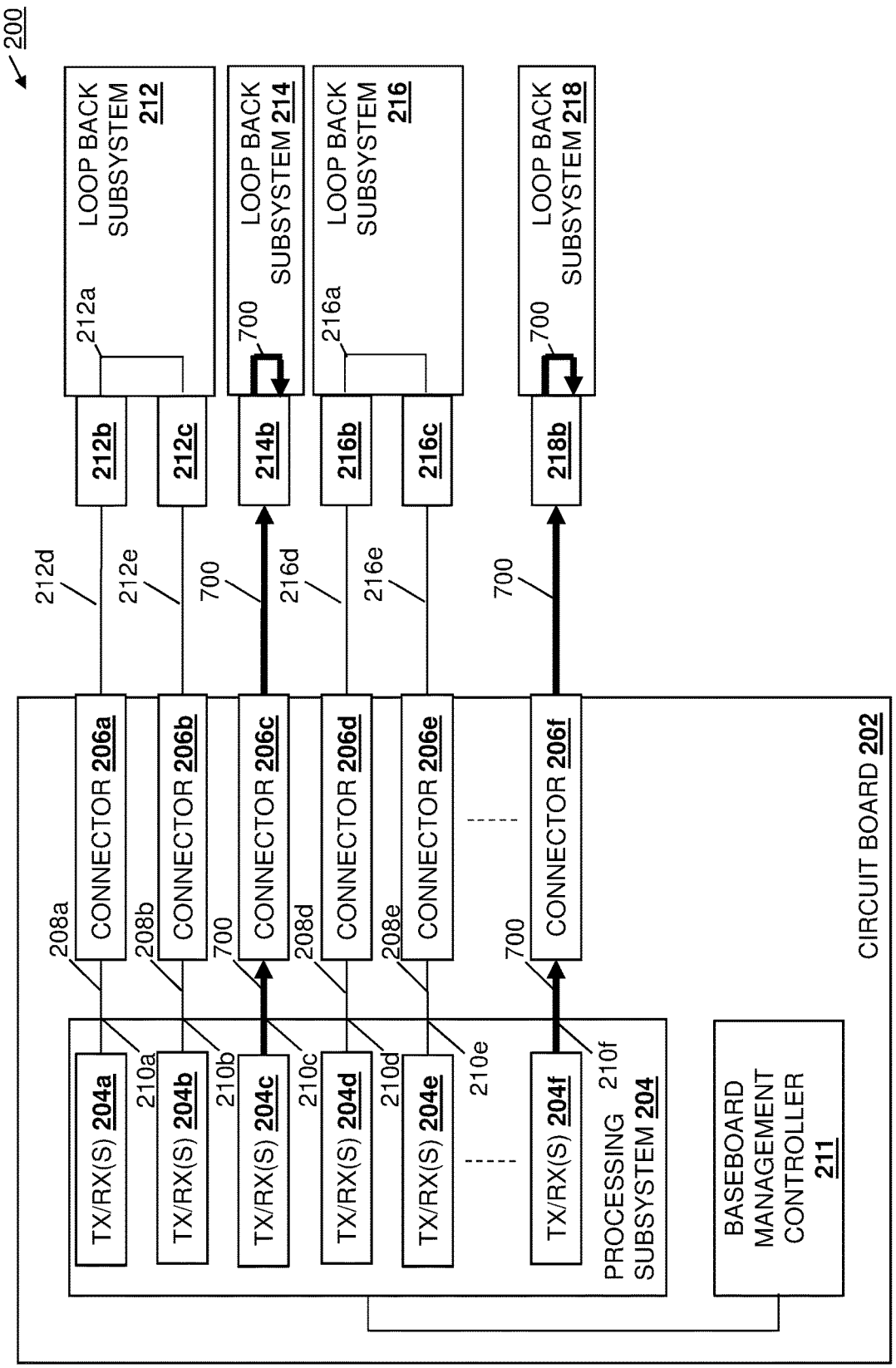
FIG. 7A is a schematic view illustrating an embodiment of the high-speed signal subsystem testing system of FIG. 2 operating during the method of FIG. 5.

With reference to FIGS. 2 and 7A, in an embodiment of block 502 that illustrates the use of single-connector loop back subsystems, a transmitter in the transmitter/receiver(s) 204c may perform test signal transmission operations 700 that include transmitting test signal(s) via the BGA pad 210c, the trace 208c, the connector 206c, and the cable 214c, such that the test signal(s) are received by the loop back subsystem 214 via its loop back connector 214a and provided back to the loop back connector 214a. Similarly, with reference to FIGS. 2 and 7A, a transmitter in the transmitter/receiver(s) 204f may perform the test signal transmission operations 700 that include transmitting test signal(s) via the BGA pad 210f, the trace 208f, the connector 206f, and the cable 218c, such that the test signal(s) are received by the loop back subsystem 218 via its loop back connector 218a and provided back to the loop back connector 218a.

Figure 9:
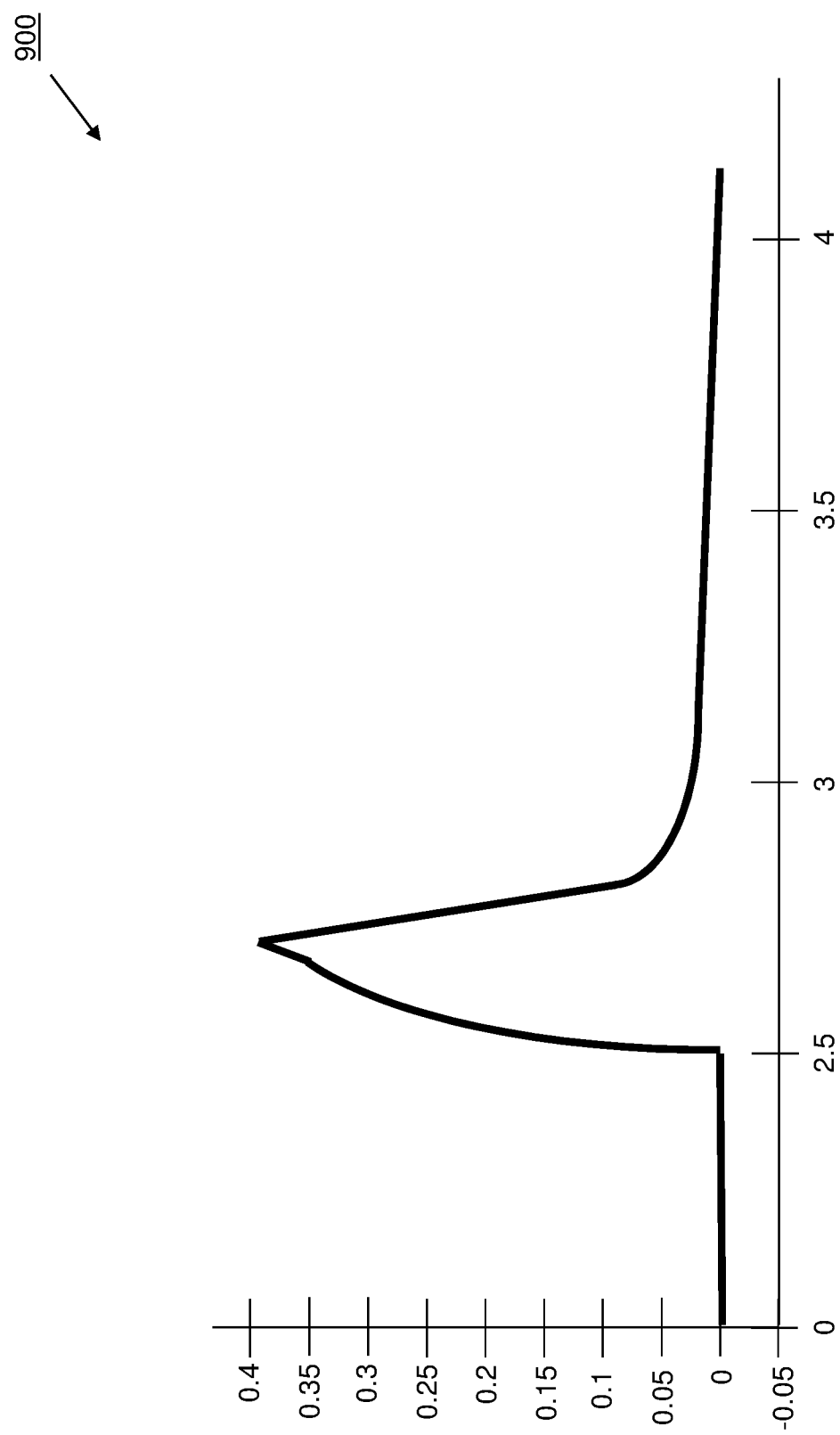
FIG. 9 is an embodiment of a test signal response that may be generated in the high-speed signal subsystem testing system of FIG. 2 during the method of FIG. 5.

The method 500 then proceeds to block 504 where the communication path testing subsystem receives test signal result(s) via a receiver and through a testing communication path provided by the loop back subsystem. In an embodiment, at block 504, the communication path testing engine provided by the baseboard management controller 211 and/or the processing system 204 may receive test signal result(s) via any receiver in the transmitter receivers 204a-204f that is connected via a testing communication path to a transmitter that transmitted a test signal through that testing communication path at block 502. For example, with reference to FIG. 9, an embodiment of a test signal result 900 is illustrated. As will be appreciated by one of skill in the art in possession of the present disclosure, the test signal result 900 is illustrated as being provided by a reflection that results from the test signal/step function discussed above, and in specific examples may be provided by a Time-Domain Reflectometer (TDR) test signal result/reflection. For example, the test signal result 900 may be provided by a finite difference time domain pulse that results at a receiver from the transmission by a transmitter of a step function through a communication path connected to that receiver. As such, the test signal result 900 may be received by any of the receivers in the transmitter receivers 204a-204f at block 504 via the communication path 300 connected to that receiver. However, while a specific test signal result has been described, one of skill in the art in possession of the present disclosure will appreciate how other test signal results may be utilized while remaining within the scope of the present disclosure as well.

Figure 6B:
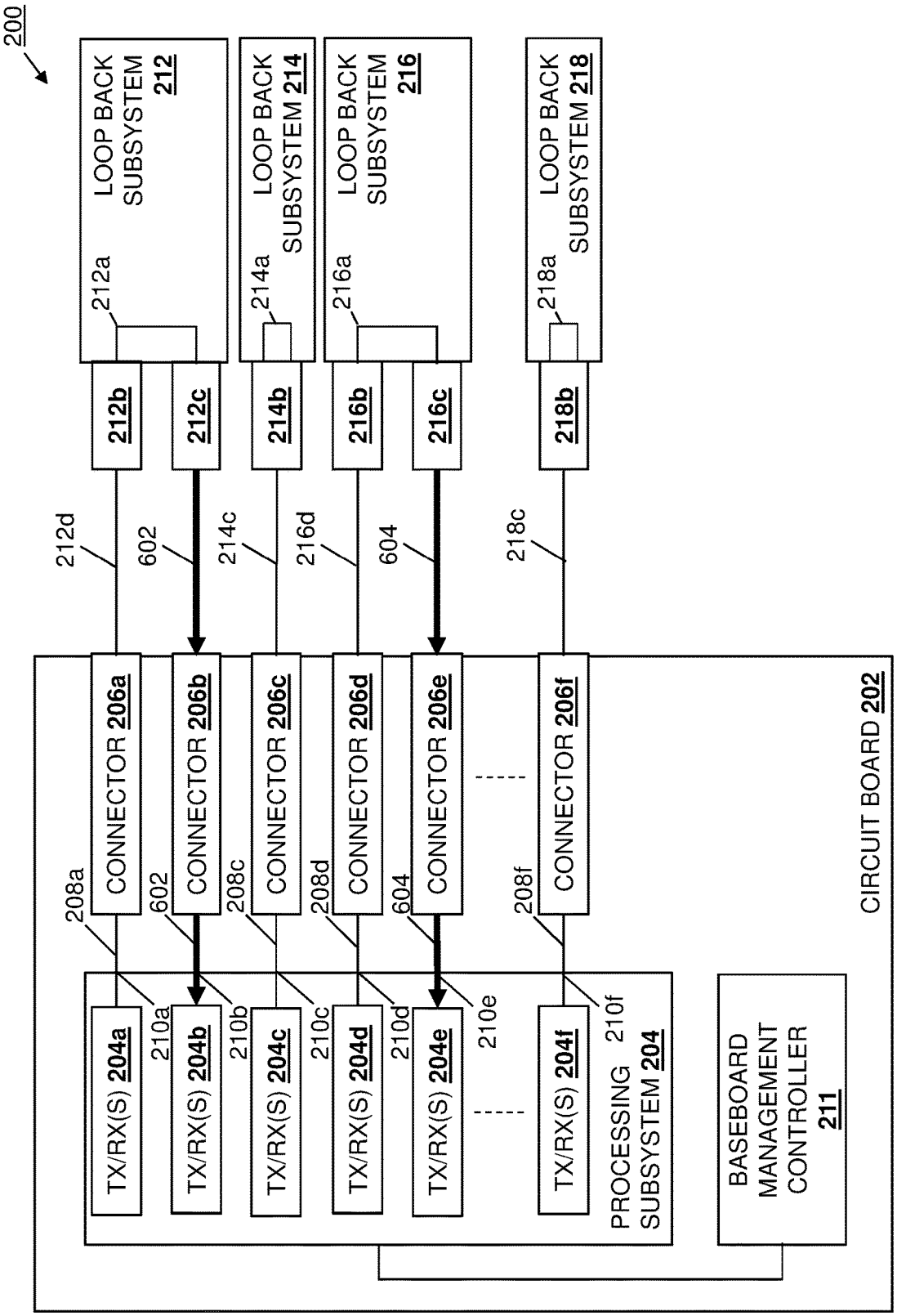
FIG. 6B is a schematic view illustrating an embodiment of the high-speed signal subsystem testing system of FIG. 2 operating during the method of FIG. 5.

With reference to FIGS. 2 and 6B and in an embodiment of block 504 that illustrates the use of multi-connector loop back subsystems, a receiver in the transmitter/receiver(s) 204b may perform test signal result receiving operations 602 that include receiving test signal result(s) via the BGA pad 210*b*, the trace 208*b*, the connector 206*b*, and the cable 212*e* from the loop back connector 212*c* on the loop back subsystem 212. Similarly, with reference to FIGS. 2 and 6*b*, a receiver in the transmitter/receiver(s) 204*e* may perform the test signal result receiving operations 602 that include receiving test signal result(s) via the BGA pad 210*e*, the trace 208*e*, the connector 206*e*, and the cable 218*e* from the loop back connector 216*c* on the loop back subsystem 216.

Figure 7B:
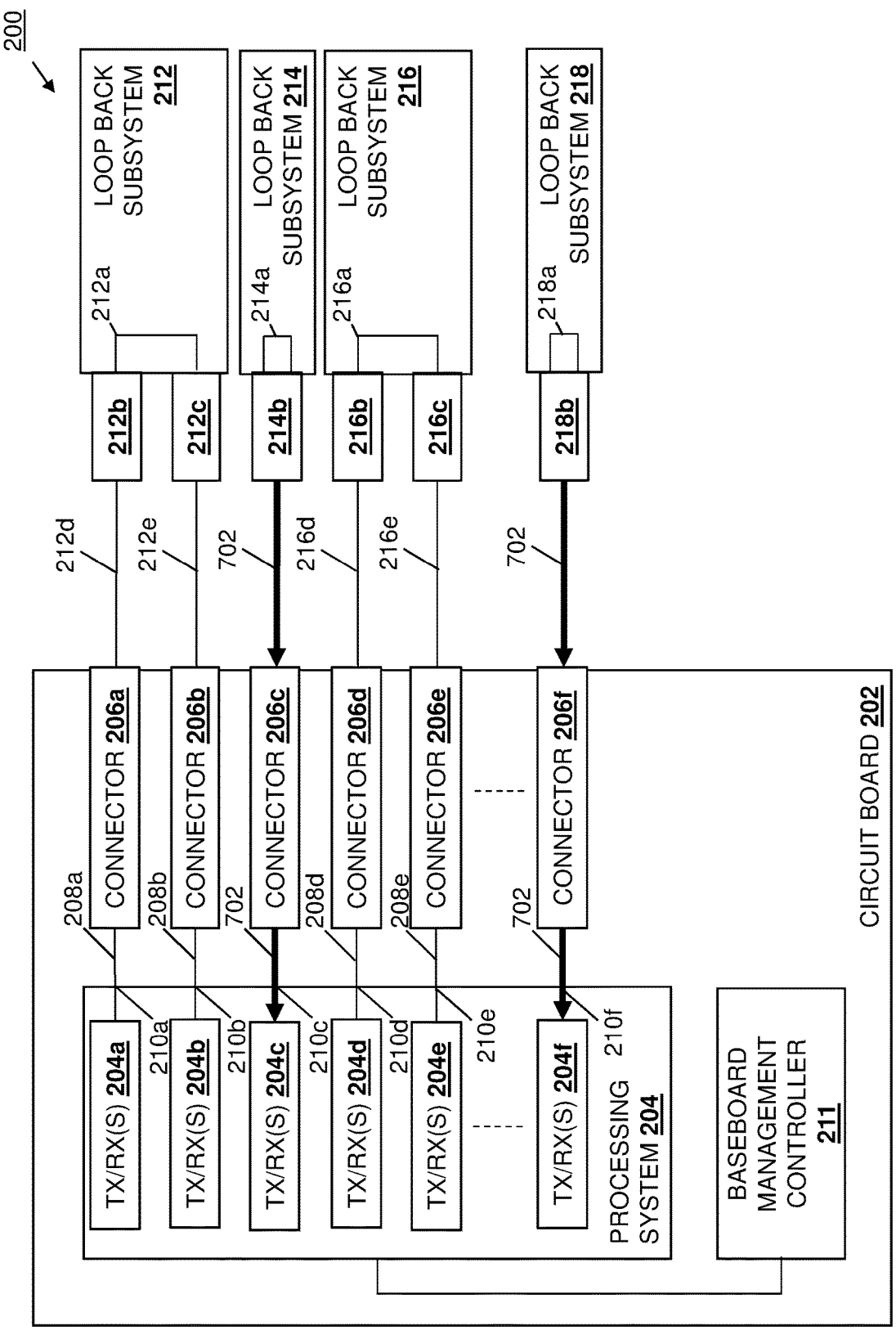
FIG. 7B is a schematic view illustrating an embodiment of the high-speed signal subsystem testing system of FIG. 2 operating during the method of FIG. 5.

With reference to FIGS. 2 and 7B, in an embodiment of block 504 that illustrates the use of single-connector loop back subsystems, a receiver in the transmitter/receiver(s) 204*c* may perform test signal result receiving operations 702 that include receiving test signal result(s) via the BGA pad 210*c*, the trace 208*c*, the connector 206*c*, and the cable 214*c* from the loop back connector 214*b* on the loop back subsystem 214. Similarly, with reference to FIGS. 2 and 7A, a receiver in the transmitter/receiver(s) 204*f* may perform the test signal result receiving operations 702 that include receiving test signal result(s) via the BGA pad 210*f*, the trace 208*f*, the connector 206*f*, and the cable 218*c* from the loop back connector 218*b* on the loop back subsystem 218.

With reference back to FIG. 4, the test signal result(s) may be received by the receiver 400 and provided to the multiplexer 404. As discussed above, the multiplexer 404 may provide any test signal result(s) through the first receiver signal path that includes the clock data recovery subsystem 402*a*, the automatic gain control/continuous time linear equalizer subsystem 402*b*, the digital front end subsystem 402*c*, and the latch subsystem 402*d*, each of which may perform any of a variety of conventional receiver operations known in the art on the test signal result(s). As also discussed above, the multiplexer 404 may also provide any test signal result(s) through the second receiver signal path that includes the analog-to-digital converter subsystem 406*a*, the linear differentiator subsystem 406*b*, and the register subsystem 406*c*. As will be appreciated by one of skill in the art in possession of the present disclosure, the baseboard management controller 408 may use its connection to the multiplexer 404 to activate the multiplexer 404 during high-speed signal subsystem testing operations in order to cause the multiplexer to provide test signal result(s) through the second receiver signal path, which allows the baseboard management controller 408 to receive any test signal result(s) and/or processed test signal result(s) from the second receiver signal path (e.g., via its connection to the register subsystem 406*c*).

Figure 10:
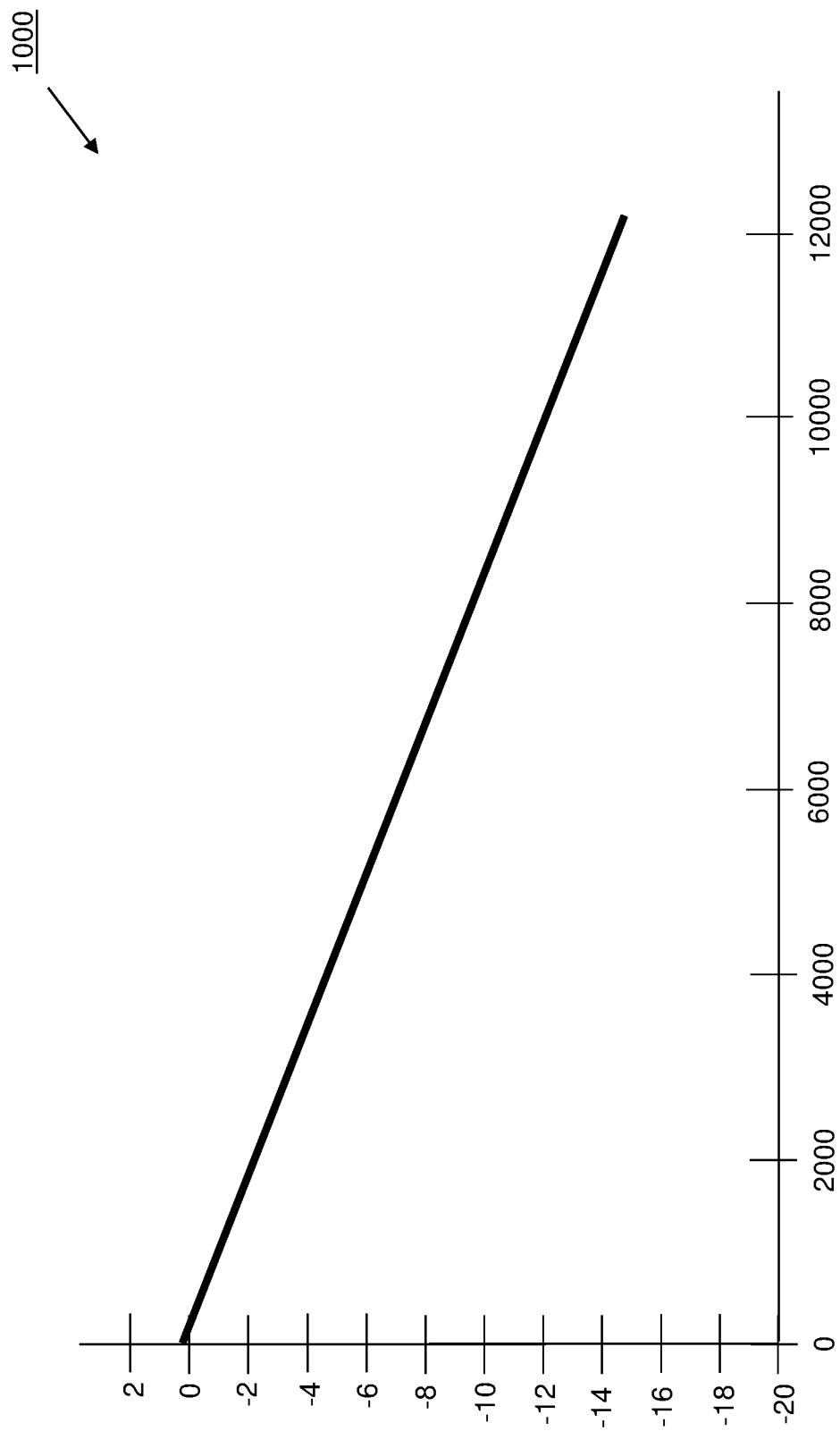
FIG. 10 is an embodiment of a transfer function that may be generated in the high-speed signal subsystem testing system of FIG. 2 during the method of FIG. 5.

The method 500 then proceeds to block 506 where the communication path testing subsystem processes the test signal result(s) to generate a testing impedance profile for the testing communication path. In an embodiment, at block 506, the test signal result(s) may be processed via the second receiver path (i.e., including the analog-to-digital converter subsystem 406*a*, the linear differentiator subsystem 406*b*, and the register subsystem 406*c*) and/or the baseboard management controller 408, and that processing may include performing a Fast Fourier Transform (FFT) on the test signal result(s) to generate a transfer function. For example, with reference to FIG. 10, an example of a transfer function 1000 is illustrated that may be generated by performing an FFT on the test signal result 900 discussed above with reference to FIG. 9. In a specific example, the transfer function 1000 may be generated by performing the FFT on the test signal result 900 in a manner described by one of the inventors of the present disclosure in U.S. Pat. No. 9,785,607, issued on Oct. 10, 2017, and U.S. Pat. No. 9,634,777, issued on Apr. 25, 2017, the disclosures of which are incorporated by reference herein in their entirety. The transfer function may then be processed via the second receiver path (i.e., including the analog-to-digital converter subsystem 406*a*, the linear differentiator subsystem 406*b*, and the register subsystem 406*c*) and/or the baseboard management controller 408 to generate an impedance profile (e.g., TDR information and/or loss information) for the communication path 300 between the transmitter 304 and the receiver 306 discussed above with reference to FIG. 3. In a specific example, the transfer function may then be convolved with any time-domain signal pattern to generate an output waveform, and with impedance transfer function a, a step response in time domain (e.g., a bit stream having a series of 0's followed by a relatively long series of 1's) may be convolved with the transfer function.

To provide a specific example, assuming a test signal result received at a receiver is x(t), that test signal result x(t) may be represented as discrete values:

$$x(t)=x(n), \text{ where } n=0,1,2,\ldots N-1,N$$

The finite difference of x(n) can be estimated as:

$$x'(t) = \frac{x(n+1) - x(n)}{(\Delta t)};$$

$$x'(n) = x(n+1) - x(n)$$

Once the finite difference is estimated, a frequency domain conversion may provide:

$$X(k) = \sum_{n=0}^{N-1} x(n) \cdot e^{-i\left(\frac{2\pi}{M}\right)kn} \text{ where } k = 0, 1, 2, \ldots N-1, N$$

The transfer function value at the frequency of interest may be "k/2pi", and the transfer function of the return loss may be estimated as:

$$y(k) = \sum_{n=0}^{N-1} \sqrt{1 - x(k)^2} \text{ where } k = 0, 1, 2, \ldots N-1, N$$

The time-domain impedance transfer function may then be derived as:

$$y(n) = \frac{1}{N}\sum_{k=0}^{N-1} y(k) \cdot e^{i\left(\frac{2\pi}{N}\right)kn} \text{ where } n = 0, 1, 2, \ldots N-1, N$$

As will be appreciated by one of skill in the art in possession of the present disclosure, if the transfer function is $S_{21}$, then the impedance profile $S_{11}$ may be estimated from:

$$S_{11} = S^2_{21} + S^2_{11}$$

One of skill in the art in possession of the present disclosure will recognize how the processing of the test signal result(s) discussed above may operate to estimate silicon-to-silicon impedance and/or silicon-to-silicon loss, and that losses in connectivity in a communication path will show up in both TDR/impedance measurements and loss measurements. However, while specific processing equations and techniques for generating an impedance profile have been described, one of skill in the art in possession of the present disclosure will appreciate how the impedance profiles discussed below may be generated using a variety of other techniques while remaining within the scope of the present disclosure as well.

Figure 11A:
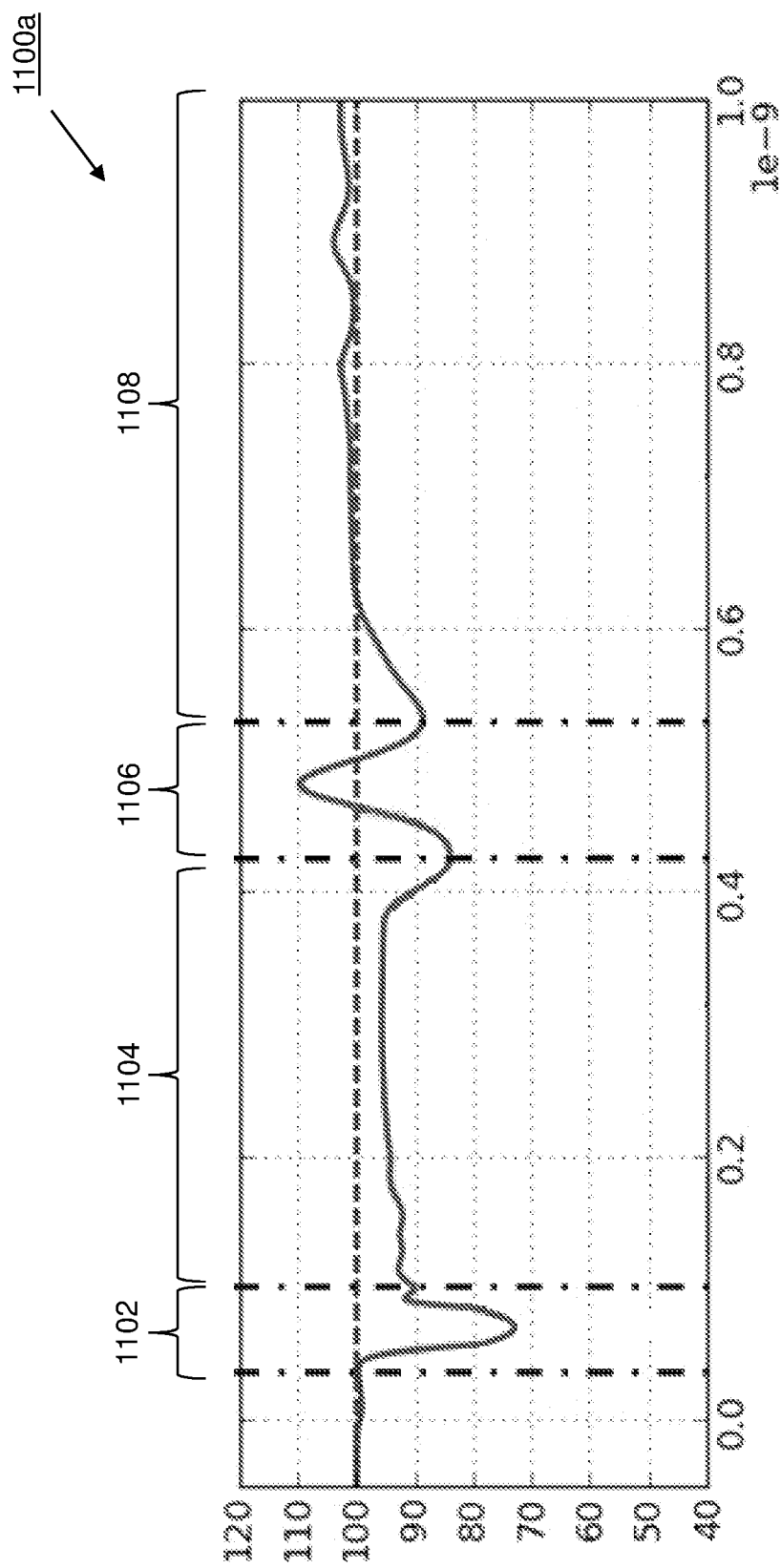
FIG. 11A is an embodiment of an impedance profile that may be generated in the high-speed signal subsystem testing system of FIG. 2 during the method of FIG. 5.

With reference to FIG. 11A, an embodiment of an impedance profile 1100a for a communication path between a transmitter and a receiver that does not include any communication path issues (e.g., processing system mounting element issues such as BGA cracks, circuit board trace issues, connector issues such as SMT pad peeling and/or shorting, cable issues such as cabling cracks, etc.) is illustrated. As can be seen in FIG. 11A, the impedance profile 1100a may include a processing system portion 1102 that details impedance for the processing system including the transmitter and receiver, its mounting to a circuit board, and/or other processing system elements included in the communication path. The impedance profile 1100a also includes a circuit board portion 1104 that details impedance for the circuit board, its traces, and/or other circuit board components included in the communication path. The impedance profile 1100a also includes a connector portion 1106 that details impedance for the connector, its mounting to a circuit board, and/or other connector elements included in the communication path. The impedance profile 1100a also includes a cabling portion 1108 that details impedance for the cable, its connection to a connector, and/or other cabling elements included in the communication path.

As discussed below, the impedance profile 1100a illustrated in FIG. 11A may provide an expected impedance profile for a particular communication path between a transmitter and a receiver that is known to not include any communication path issues (e.g., processing system mounting element issues such as BGA cracks, circuit board trace issues, connector issues such as SMT pad peeling and/or shorting, cable issues such as cabling cracks, etc.), and thus a similar expected impedance profile may be generated for any communication path that is to-be tested by identifying a communication path that has the same configuration and no communication path issues, and then generating the impedance profile for that communication path (which becomes an "expected impedance profile"), and subsequently comparing testing impedance profiles generated for similarly-configured communication paths to that expected impedance profile to determine whether any communication path issues exist. However, while a specific technique for generating an expected impedance profile is described, one of skill in the art in possession of the present disclosure will appreciate how expected impedance profiles may be generated using other techniques (e.g., generating expected impedance profiles via simulations) while remaining within the scope of the present disclosure as well.

Figure 11B:
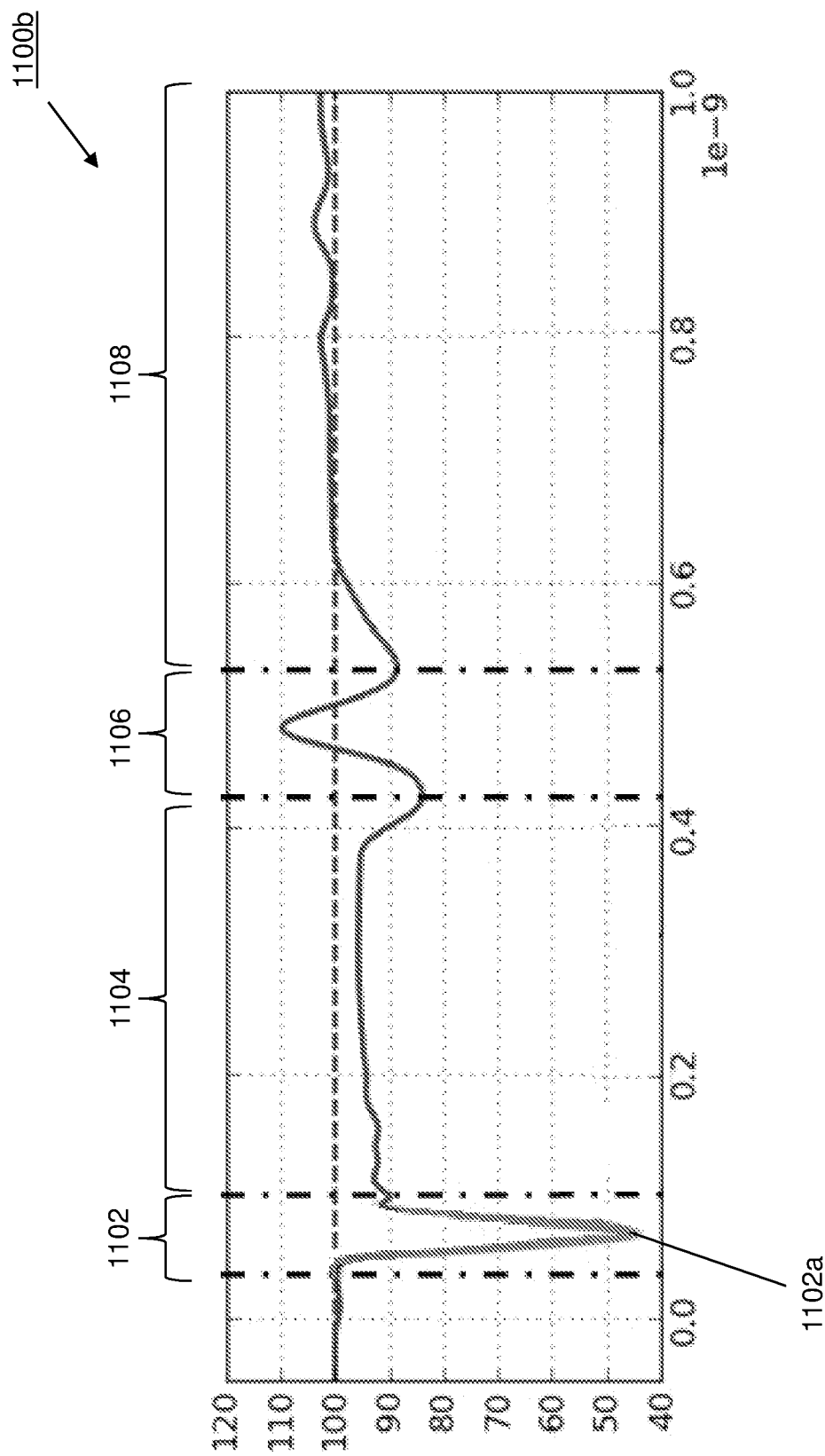
FIG. 11B is an embodiment of an impedance profile that may be generated in the high-speed signal subsystem testing system of FIG. 2 during the method of FIG. 5.

With reference to FIG. 11B, an embodiment of an impedance profile 1100b for a communication path between a transmitter and a receiver that includes a communication path issue (e.g., a processing system mounting element issue such as BGA cracks in this example) is illustrated, and one of skill in the art in possession of the present disclosure will appreciate how the communication path for which the impedance profile 1100b illustrated in FIG. 11B was generated may have a similar configuration to the communication path for which the impedance profile 1100a illustrated in FIG. 11A was generated. As can be seen in FIG. 11B, the impedance profile 1100b is substantially similar to the impedance profile 1100a, but with the processing system portion 1102 (which details impedance for the processing system including the transmitter and receiver, its mounting to a circuit board, and/or other processing system elements included in the communication path as discussed above with reference to the impedance profile 1100a in FIG. 11A) including communication path issue element 1102a that indicates a processing system mounting element issue, discussed in further detail below.

Figure 11C:
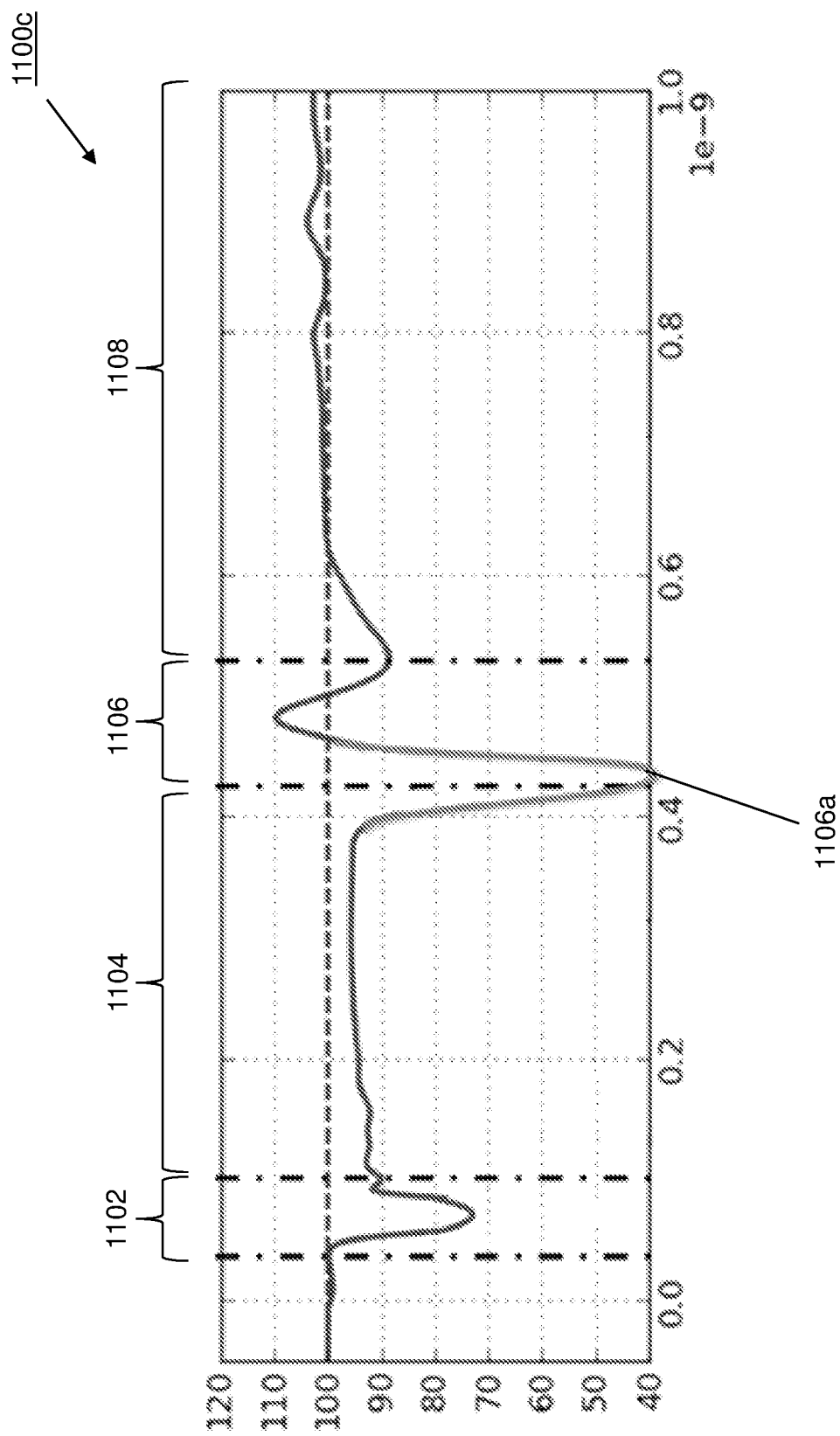
FIG. 11C is an embodiment of an impedance profile that may be generated in the high-speed signal subsystem testing system of FIG. 2 during the method of FIG. 5.

With reference to FIG. 11C, an embodiment of an impedance profile 1100c for a communication path between a transmitter and a receiver that includes a communication path issue (e.g., a connector issue such as SMT pad peeling and/or shorting in this example) is illustrated, and one of skill in the art in possession of the present disclosure will appreciate how the communication path for which the impedance profile 1100c illustrated in FIG. 11C was generated may have a similar configuration to the communication path for which the impedance profile 1100a illustrated in FIG. 11A was generated. As can be seen in FIG. 11C, the impedance profile 1100c is substantially similar to the impedance profile 1100a, but with the connector portion 1106 (which details impedance for the connector, its mounting to a circuit board, and/or other connector elements included in the communication path as discussed above with reference to the impedance profile 1100a in FIG. 11A) including communication path issue element 1106a that indicates a connector issue, discussed in further detail below.

Figure 11D:
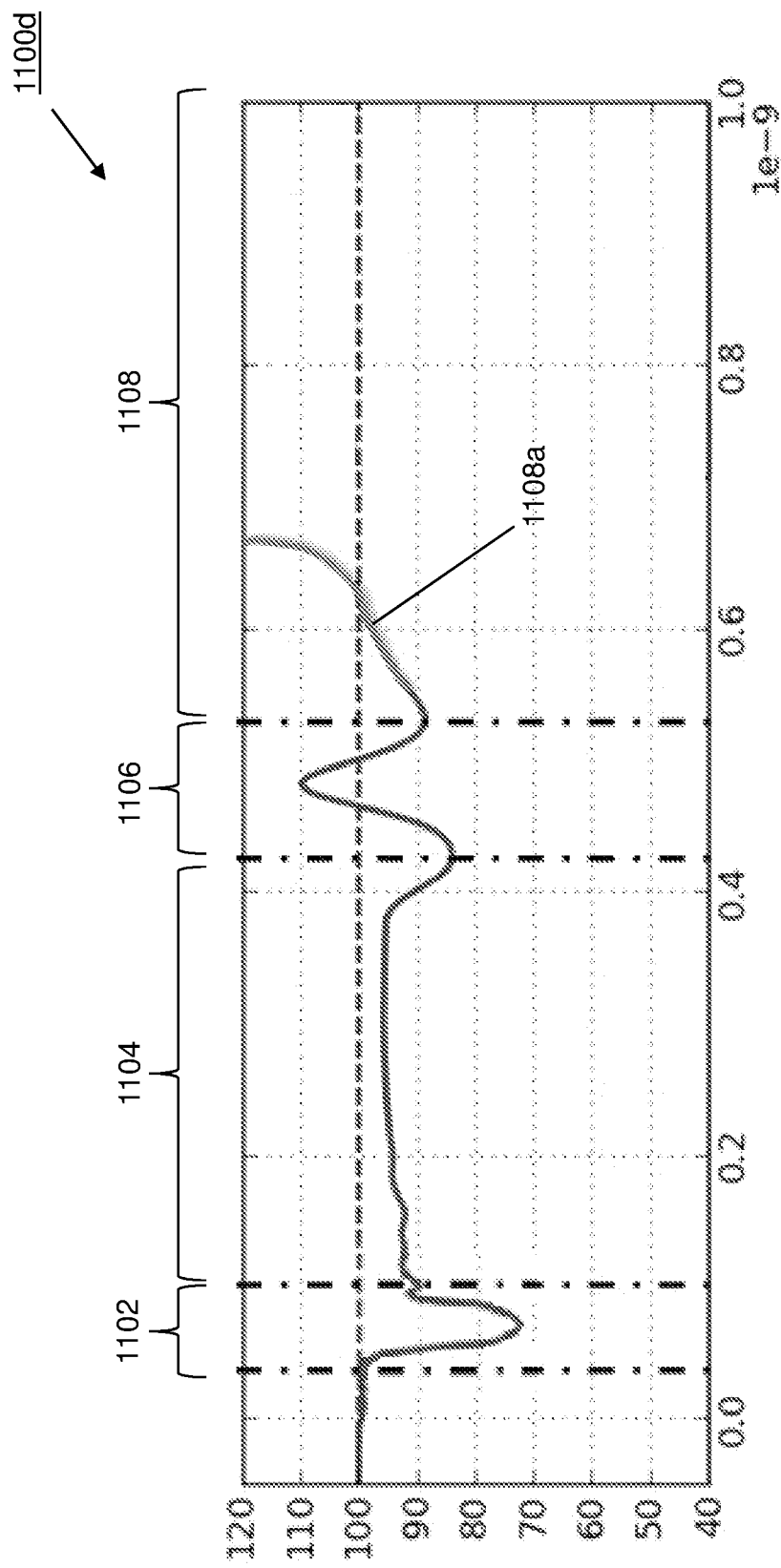
FIG. 11D is an embodiment of an impedance profile that may be generated in the high-speed signal subsystem testing system of FIG. 2 during the method of FIG. 5.

With reference to FIG. 11D, an embodiment of an impedance profile 1100d for a communication path between a transmitter and a receiver that includes a communication path issue (e.g., a cable issue such as cabling cracks in this example) is illustrated, and one of skill in the art in possession of the present disclosure will appreciate how the communication path for which the impedance profile 1100d illustrated in FIG. 11D was generated may have a similar configuration to the communication path for which the impedance profile 1100a illustrated in FIG. 11A was generated. As can be seen in FIG. 11D, the impedance profile 1100d is substantially similar to the impedance profile 1100a, but with the cabling portion 1108 (which details impedance for the cable, its connection to a connector, and/or other cabling elements included in the communication path as discussed above with reference to the impedance profile 1100a in FIG. 11A) including communication path issue element 1108a that indicates a cable issue, discussed in further detail below.

The method 500 then proceeds to block 508 where the communication path testing subsystem compares the testing impedance profile for the testing communication path to an expected impedance profile. In an embodiment, at block 508, the communication path testing engine provided by the baseboard management controller 211 may compare the testing impedance profile generated at block 506 to an expected impedance profile. Continuing with the examples provided below, at block 508 the baseboard management controller 211 may compare the impedance profile 1100a generated at block 508 to an expected impedance profile (which may also be provided by an impedance profile that is substantially similar to the impedance profile 1100a). Similarly, at block 508 the baseboard management controller 211 may compare the impedance profile 1100b generated at block 508 to an expected impedance profile (which may be provided by the impedance profile 1100a or an impedance profile that is substantially similar to the impedance profile 1100a). Similarly, at block 508 the baseboard management controller 211 may compare the impedance profile 1100c generated at block 508 to an expected impedance profile (which may be provided by the impedance profile 1100a or an impedance profile that is substantially similar to the impedance profile 1100a). Similarly, at block 508 the baseboard management controller 211 may compare the impedance profile 1100d generated at block 508 to an expected impedance profile (which may be provided by the impedance profile 1100a or an impedance profile that is substantially similar to the impedance profile 1100a).

The method 500 then proceeds to decision block 510 where it is determined whether a testing communication path issue exists. In an embodiment, at decision block 510, the communication path testing engine provided by the baseboard management controller 211 may determine whether a communication path issue exists in the communication path for which the impedance profile was generated at block 506. Continuing with the examples provided below, in an embodiment of decision block 510, the baseboard management controller 211 may determine that no communication path issue exists in the communication path for which the impedance profile 1100a was generated at block 508 due to it being substantially similar to that expected impedance profile (which may also be provided by an impedance profile that is substantially similar to the impedance profile 1100a).

However, in an embodiment of decision block 510, the baseboard management controller 211 may determine that a communication path issue exists in the communication path for which the impedance profile 1100b was generated at block 508 due to the communication path issue element 1102a that is not present in the expected impedance profile (which may be provided by an impedance profile that is substantially similar to the impedance profile 1100a) and that indicates a processing system mounting element issue in that communication path. Similarly, in an embodiment of decision block 510, the baseboard management controller 211 may determine that a communication path issue exists in the communication path for which the impedance profile 1100c was generated at block 508 due to the communication path issue element 1106a that is not present in the expected impedance profile (which may be provided by an impedance profile that is substantially similar to the impedance profile 1100a) and that indicates a connector issue in that communication path. Similarly, in an embodiment of decision block 510, the baseboard management controller 211 may determine that a communication path issue exists in the communication path for which the impedance profile 1100d was generated at block 508 due to the communication path issue element 1108a that is not present in the expected impedance profile (which may be provided by an impedance profile that is substantially similar to the impedance profile 1100a) and that indicates a cabling issue in that communication path. As will be appreciated by one of skill in the art in possession of the present disclosure, the extent of a communication path issue can be gauged by comparing the TDR/impedance measurements and/or loss measurements of the testing communication path with those of a "golden" communication path, a simulated communication path, and/or an actual communication path that is known to not have communication path issues.

If, at decision block 510, it is determined that a testing communication path issue exists, the method 500 proceeds to block 512 where the communication path testing subsystem generates and transmits a testing communication path issue communication. In an embodiment, at block 512 and in response to detecting that a communication path issue exists in a testing communication path, the communication path testing engine provided by the baseboard management controller 211 may generate and transmit a communication path issue communication to a testing computing device in order to display to a user the communication path issue detected for the communication path being tested. As such, when the TDR/impedance measurements and/or loss measurements of the testing communication path differ some amount from those of a "golden" communication path, a simulated communication path, and/or an actual communication path that is known to not have communication path issues, then the circuit board or device including that communication path may be flagged or otherwise identified as a circuit board or device with a communication path issue. Following block 512, or if at decision block 510 it is determined that no testing communication path issue exists, the method 500 returns to block 502. As such, the method 500 may loop such that communication paths provided by each of the loop back subsystems 212, 214, 216, and up to 218 may be tested, and any communication path determined to have communication path issue(s) may be identified to a user of the high-speed signal subsystem testing system of the present disclosure.

In some embodiments, the high-speed signal subsystem testing system of the present disclosure may also operate to transmit a predetermined bitstream of data using a transmitter and via a communication channel provided between that transmitter and a receiver as discussed above, and then analyze the bitstream received at that receiver to determine whether the it is the same as the bitstream that was transmitted by the transmitter. As will be appreciated by one of skill in the art in possession of the present disclosure, the bitstream analysis discussed above may be utilized to identify information about the high-speed connectivity health of the communication path, but will not provide details in terms of the level of impact of communication path issues, or the location of communication path issues.

Thus, the systems and methods of the present disclosure provide for non-invasive high-speed signaling subsystem testing of a communication path between transmitter and a receiver that may include trace(s) on a circuit board, connection(s) of the transmitter trace(s) to the transmitter and receiver in a processing system via a pad on the circuit board to which the processing system is mounted, the connection of the transmitter trace(s) to connector(s) on the circuit board, the connector(s), and cabling connected to the connector(s). For example, the high-speed signal subsystem testing system of the present disclosure may include a processing system having a transmitter and a receiver, a loop back subsystem coupled to the transmitter and receiver to provide a testing communication path between the transmitter and the receiver, and a communication path testing engine coupled to the transmitter and the receiver. The communication path testing engine generates test signal(s) and transmits the test signal(s) via the transmitter and through the testing communication path provided by the loop back subsystem and, in response, receives test signal result(s) via the receiver and through the testing communication path provided by the loop back subsystem, The communication path testing engine processes the test signal result(s) to generate a testing impedance profile for the testing communication path, and compares the testing impedance profile to an expected impedance profile to determine whether a testing communication path issue exists in the testing communication path. As such, communication paths between transmitters and receivers on circuit boards may be tested to determine whether any portion of the high-speed signal subsystem associated with that communication path is experiencing issues that would prevent its desired operation.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A high-speed signal subsystem testing system, comprising:
- a processing system having a transmitter and a receiver;
- a loop back subsystem coupled to each of the transmitter and the receiver to provide a testing communication path between the transmitter and the receiver that includes a plurality of different testing communication path portions; and
- a communication path testing engine that is coupled to the transmitter and the receiver, wherein the communication path testing engine is configured to:
  - generate at least one test signal and transmit the at least one test signal via the transmitter and through the testing communication path provided by the loop back subsystem;
  - receive, in response to transmitting the at least one test signal, at least one test signal result via the receiver and through the testing communication path provided by the loop back subsystem;
  - process the at least one test signal result to generate a testing impedance profile for the testing communication path that identifies a varying impedance across the plurality of different testing communication path portions included in the testing communication path;
  - compare the testing impedance profile for the testing communication path to an expected impedance profile and determine that at least one testing communication path issue exists in any of the plurality of different testing communication path portions included in the testing communication path; and
  - generate and transmit, in response to determining that the at least one testing communication path issue exists in any of the plurality of different testing communication path portions included in the testing communication path, a testing communication path issue communication.

2. The system of claim 1, wherein the at least one test signal is provided by at least one step function and the at least one test signal result is provided by at least one reflection.

3. The system of claim 2, wherein the at least one test signal is at least one Time-Domain Reflectometer (TDR) test signal and the at least one test signal result is at least one TDR reflection.

4. The system of claim 1, wherein the processing of the at least one test signal result to generate the testing impedance profile for the testing communication path includes performing a Fast Fourier Transform (FFT) on the at least one test signal result to generate a transfer function, and generating the testing impedance profile for the testing communication path based on the transfer function.

5. The system of claim 1, wherein the plurality of different testing communication path portions included in the testing communication path provided between the transmitter and the receiver by the loop back subsystem includes at least one processing system mounting element portion, at least one circuit board trace portion, at least one connector portion, and at least one cable portion.

6. The system of claim 1, wherein the testing communication path issue includes at least one of a processing system mounting element issue, a circuit board trace issue, a connector issue, or a cable issue.

7. The system of claim 1, wherein the communication path testing engine is configured to:
- generate the expected impedance profile using an expected communication path in which no testing communication path issues exist.

8. An Information Handling System (IHS), comprising:
- a processing system; and
- a memory system that is coupled to the processing system and that includes instructions that, when executed by the processing system, cause the processing system to provide a communication path testing engine that is configured to:
  - generate at least one test signal and transmit the at least one test signal via a transmitter and through a testing communication path that is provided by a loop back subsystem between the transmitter and a receiver and that includes a plurality of different testing communication path portions;
  - receive, in response to transmitting the at least one test signal, at least one test signal result via the receiver and through the testing communication path that is provided by the loop back subsystem between the transmitter and the receiver and that includes a plurality of different testing communication path portions;
  - process the at least one test signal result to generate a testing impedance profile for the testing communication path that identifies a varying impedance across the plurality of different testing communication path portions included in the testing communication path;
  - compare the testing impedance profile for the testing communication path to an expected impedance profile to determine whether a testing communication path issue exists in any of the plurality of different testing communication path portions included in the testing communication path; and
  - generate and transmit, in response to determining that the at least one testing communication path issue exists in any of the plurality of different testing communication path portions included in the testing communication path, a testing communication path issue communication.

9. The IHS of claim 8, wherein the at least one test signal is provided by at least one Time-Domain Reflectometer (TDR) step function and the at least one test signal result is provided by at least one TDR reflection.

10. The IHS of claim 8, wherein the processing of the at least one test signal result to generate the testing impedance profile for the testing communication path includes performing a Fast Fourier Transform (FFT) on the at least one test signal result to generate a transfer function, and generating the testing impedance profile for the testing communication path based on the transfer function.

11. The IHS of claim 8, wherein the plurality of different testing communication path portions included in the testing communication path provided between the transmitter and the receiver by the loop back subsystem includes at least one processing system mounting element portion, at least one circuit board trace portion, at least one connector portion, and at least one cable portion.

12. The IHS of claim 8, wherein the testing communication path issue includes at least one of a processing system mounting element issue, a circuit board trace issue, a connector issue, or a cable issue.

13. The IHS of claim 7, wherein the communication path testing engine is configured to:
generate the expected impedance profile using an expected communication path in which no testing communication path issues exist.

14. A method for testing high-speed signaling subsystem, comprising:
generating, by a communication path testing subsystem, at least one test signal;
transmitting, by the communication path testing subsystem, the at least one test signal via a transmitter and through a testing communication path that is provided by a loop back subsystem between the transmitter and a receiver and that includes a plurality of different testing communication path portions;
receiving, by the communication path testing subsystem in response to transmitting the at least one test signal, at least one test signal result via the receiver and through the testing communication path that is provided by the loop back subsystem between the transmitter and the receiver and that includes a plurality of different testing communication path portions;
processing, by the communication path testing subsystem, the at least one test signal result to generate a testing impedance profile for the testing communication path that identifies a varying impedance across the plurality of different testing communication path portions included in the testing communication path;
comparing, by the communication path testing subsystem, the testing impedance profile for the testing communication path to an expected impedance profile to determine whether a testing communication path issue exists in any of the plurality of different testing communication path portions included in the testing communication path; and
generating and transmitting, by the communication path testing subsystem in response to determining that the at least one testing communication path issue exists in any of the plurality of different testing communication path portions included in the testing communication path, a testing communication path issue communication.

15. The method of claim 14, wherein the at least one test signal is provided by at least one step function and the at least one test signal result is provided by at least one reflection.

16. The method of claim 15, wherein the at least one test signal is at least one Time-Domain Reflectometer (TDR) test signal and the at least one test signal result is at least one TDR reflection.

17. The method of claim 14, wherein the processing of the at least one test signal result to generate the testing impedance profile for the testing communication path includes performing a Fast Fourier Transform (FFT) on the at least one test signal result to generate a transfer function, and generating the testing impedance profile for the testing communication path based on the transfer function.

18. The method of claim 14, wherein the plurality of different testing communication path portions included in the testing communication path provided between the transmitter and the receiver by the loop back subsystem includes at least one processing system mounting element portion, at least one circuit board trace portion, at least one connector portion, and at least one cable portion.

19. The method of claim 14, wherein the testing communication path issue includes at least one of a processing system mounting element issue, a circuit board trace issue, a connector issue, or a cable issue.

20. The method of claim 14, further comprising:
generating, by the communication path testing subsystem, the expected impedance profile using an expected communication path in which no testing communication path issues exist.

* * * * *